United States Patent
Huang et al.

(10) Patent No.: US 12,288,729 B2
(45) Date of Patent: *Apr. 29, 2025

(54) INTEGRATED CIRCUIT PACKAGE AND METHOD

(71) Applicant: Taiwan Semiconductor Manufacturing Co., Ltd., Hsinchu (TW)

(72) Inventors: Tzu-Sung Huang, Tainan (TW); Ming Hung Tseng, Toufen Township (TW); Yen-Liang Lin, Taichung (TW); Hao-Yi Tsai, Hsinchu (TW); Chi-Ming Tsai, New Taipei (TW); Chung-Shi Liu, Hsinchu (TW); Chih-Wei Lin, Zhubei (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,362

(22) Filed: Feb. 7, 2024

(65) Prior Publication Data

US 2024/0178091 A1 May 30, 2024

Related U.S. Application Data

(60) Continuation of application No. 18/297,927, filed on Apr. 10, 2023, now Pat. No. 11,935,804, which is a
(Continued)

(51) Int. Cl.
*H01L 23/31* (2006.01)
*H01L 21/56* (2006.01)
(Continued)

(52) U.S. Cl.
CPC .......... *H01L 23/3157* (2013.01); *H01L 21/56* (2013.01); *H01L 21/76802* (2013.01);
(Continued)

(58) Field of Classification Search
CPC ............. H01L 23/3157; H01L 23/5226; H01L 23/528

See application file for complete search history.

(56) References Cited

U.S. PATENT DOCUMENTS 6,297,155 B1 10/2001 Simpson et al.
8,174,119 B2 * 5/2012 Pendse ................ H01L 23/3121
257/737

(Continued)

FOREIGN PATENT DOCUMENTS

JP 2001028379 A 1/2001
JP 2012236883 A 12/2012
KR 20190013461 A 2/2019

*Primary Examiner* — Peniel M Gumedzoe
(74) *Attorney, Agent, or Firm* — Slater Matsil, LLP

(57) ABSTRACT

In an embodiment, a device includes: an integrated circuit die; an encapsulant at least partially surrounding the integrated circuit die, the encapsulant including fillers having an average diameter; a through via extending through the encapsulant, the through via having a lower portion of a constant width and an upper portion of a continuously decreasing width, a thickness of the upper portion being greater than the average diameter of the fillers; and a redistribution structure including: a dielectric layer on the through via, the encapsulant, and the integrated circuit die; and a metallization pattern having a via portion extending through the dielectric layer and a line portion extending along the dielectric layer, the metallization pattern being electrically coupled to the through via and the integrated circuit die.

20 Claims, 23 Drawing Sheets

Related U.S. Application Data continuation of application No. 17/201,856, filed on Mar. 15, 2021, now Pat. No. 11,626,339, which is a division of application No. 16/427,569, filed on May 31, 2019, now Pat. No. 10,950,519.

(51) Int. Cl.
*H01L 21/768* (2006.01)
*H01L 23/16* (2006.01)
*H01L 23/522* (2006.01)
*H01L 23/528* (2006.01)

(52) U.S. Cl.
CPC ........ *H01L 21/76843* (2013.01); *H01L 23/16* (2013.01); *H01L 23/5226* (2013.01); *H01L 23/528* (2013.01)

(56) References Cited

U.S. PATENT DOCUMENTS

| | | | |
|---|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,735,134 B2 | 8/2017 | Chen |
| 2002/0109241 A1 | 8/2002 | Kumamoto et al. |
| 2003/0071348 A1 | 4/2003 | Eguchi et al. |
| 2006/0049056 A1 | 3/2006 | Wang et al. |
| 2008/0211098 A1 | 9/2008 | Suzuki et al. |
| 2009/0179317 A1 | 7/2009 | Tida et al. |
| 2009/0283413 A1 | 11/2009 | Sato |
| 2011/0291288 A1 | 12/2011 | Wu et al. |
| 2012/0145552 A1 | 6/2012 | Nagai et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0277867 A1 | 10/2013 | Yuzuriha |
| 2013/0307140 A1 | 11/2013 | Huang et al. |
| 2014/0070403 A1 | 3/2014 | Pan et al. |
| 2014/0124922 A1 | 5/2014 | Kim et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0262909 A1 | 9/2015 | Chen |
| 2016/0064298 A1 | 3/2016 | Teh et al. |
| 2017/0032977 A1 | 2/2017 | Chen et al. |
| 2017/0103942 A1 | 4/2017 | Oi et al. |
| 2019/0035774 A1 | 1/2019 | Lai et al. |

\* cited by examiner

INTEGRATED CIRCUIT PACKAGE AND METHOD

PRIORITY CLAIM AND CROSS-REFERENCE

This application is a continuation of U.S. application Ser. No. 18/297,927, filed Apr. 10, 2023, which is a continuation of U.S. application Ser. No. 17/201,856, filed Mar. 15, 2021, now U.S. Pat. No. 11,626,339, which is a divisional of U.S. application Ser. No. 16/427,569 filed on May 31, 2019 and entitled "Integrated Circuit Package and Method," now U.S. Pat. No. 10,950,519, issued on Mar. 16, 2021, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
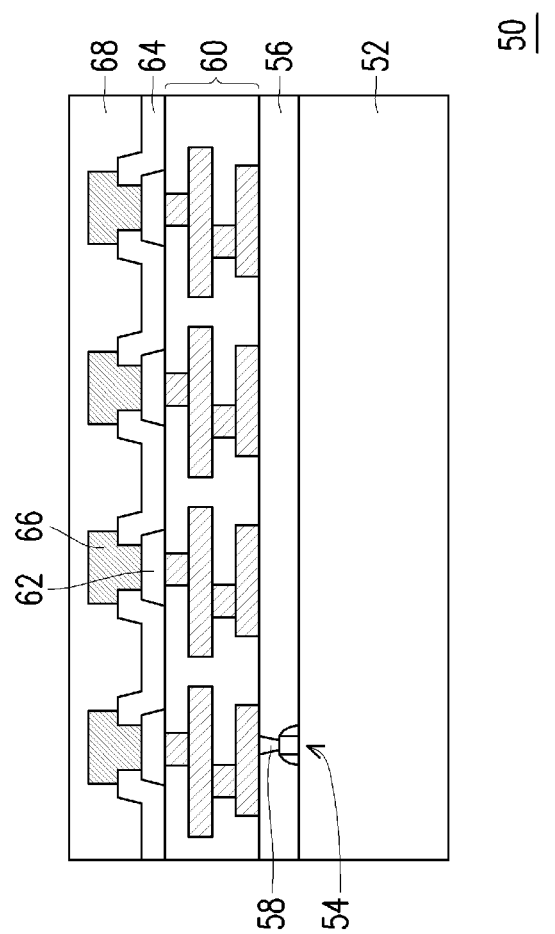
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a package component is formed having through vias extending through an encapsulant. The through vias are formed with multiple plating processes of increasing plating current densities. As a result of the increasing plating current densities, the through vias have tapered upper portions with convex topmost surfaces and continuously decreasing widths. The taper is non-linear. The tapered shapes of the through vias allows defects to be avoided during subsequent planarization process(es) for the encapsulant and through vias.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and integrated circuit dies 50 which fail the CP testing are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 16 illustrate cross-sectional views of intermediate steps during a process for forming a first package component 100, in accordance with some embodiments. The first package component 100 has multiple package regions, and one or more of the integrated circuit dies 50 are packaged to form an integrated circuit package in each of the package regions. A first package region 100A and a second package region 100B are illustrated, but it should be appreciated that the first package component 100 may have any number of package regions. After formation, the integrated circuit packages in each of the package regions are singulated. The resulting integrated circuit packages may also be referred to as integrated fan-out (InFO) packages.

Figure 2:
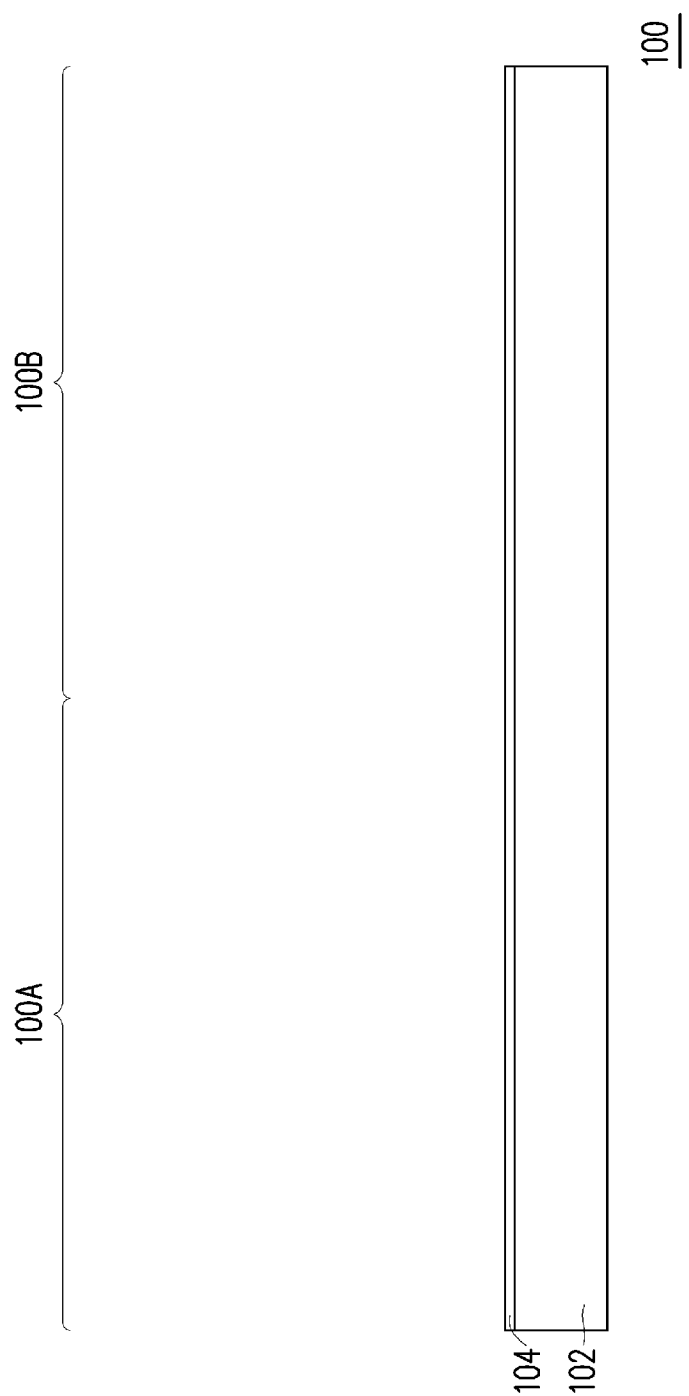
FIGS. 2, 3, 4, 5A, 5B, 5C, 5D, 5E, 6, 7, 8A, 8B, 9, 10, 11, 12, 13, 14, 15, and 16 illustrate cross-sectional views of intermediate steps during a process for forming a package component, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
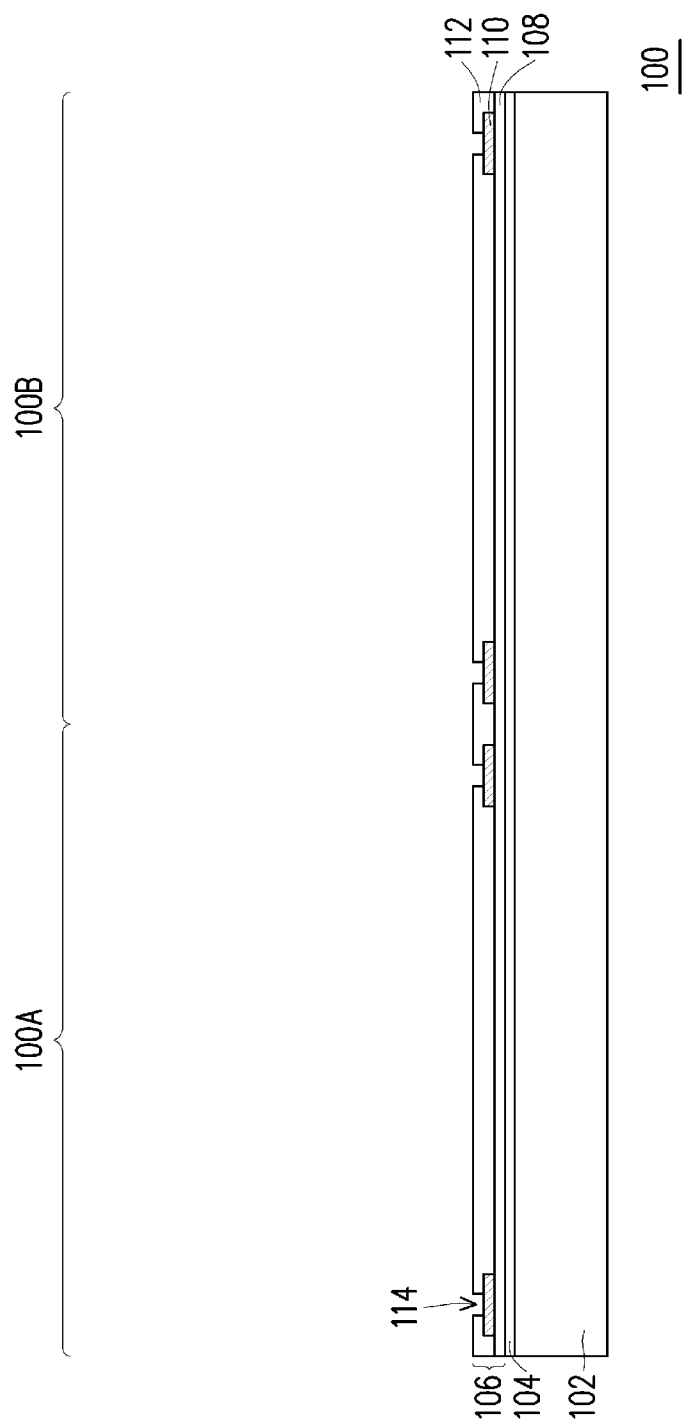

In FIG. 3, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 4:
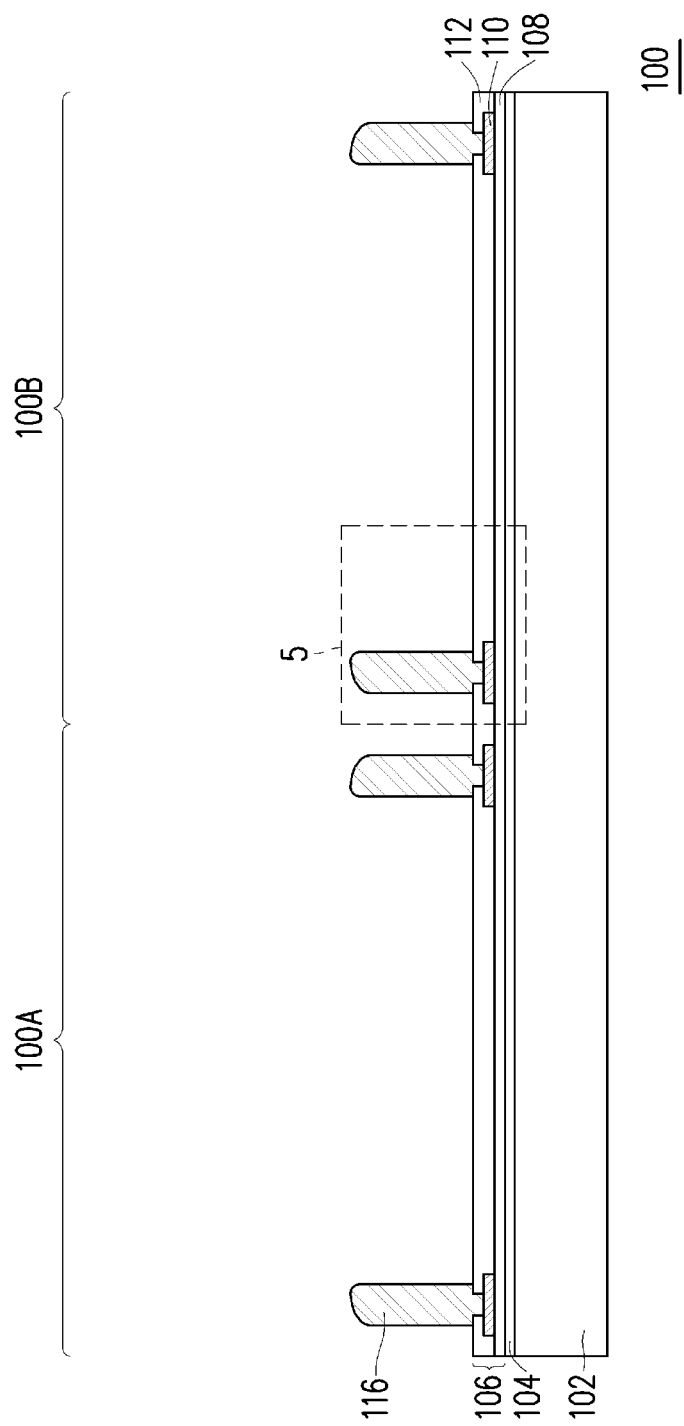

In FIG. 4, through vias 116 are formed in the openings 114 and extending away from the topmost dielectric layer of the back-side redistribution structure 106 (e.g., the dielectric layer 112). The through vias 116 physically and electrically couple the conductive features of the back-side redistribution structure 106, such as the metallization pattern 110. As discussed further below, the through vias 116 have upper widths that taper to form convex (e.g., non-flat or domed) topmost surfaces, which helps avoid defects during subsequent planarization process(es). The through vias 116 each comprise a seed layer and multiple layers of a conductive material. FIGS. 5A through 5E illustrate cross-sectional views of intermediate steps during a process for forming the through vias 116, in accordance with some embodiments. In particular, a region 5 in FIG. 4 is shown in more detail. Although the formation of a single through via 116 is illustrated, it should be appreciated that multiple through vias 116 are simultaneously formed.

Figure 5A:
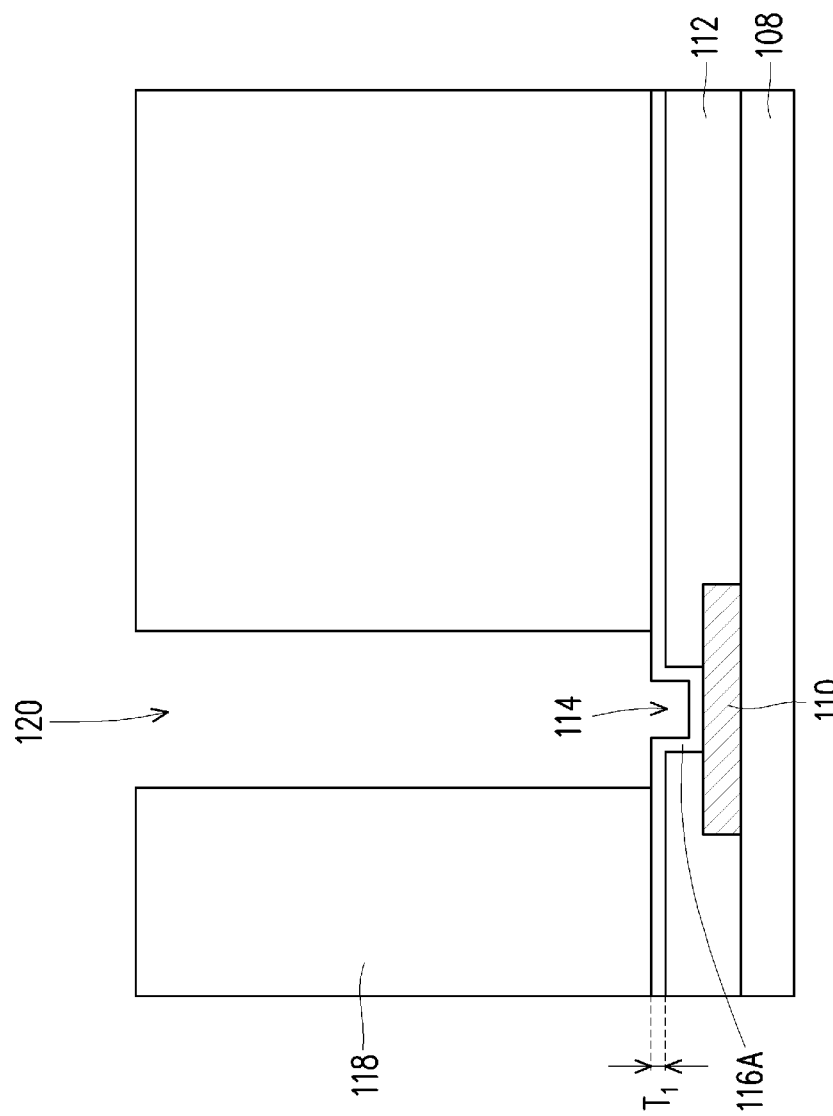

In FIG. 5A, a seed layer 116A is formed over the back-side redistribution structure 106, e.g., on the dielectric layer 112 and portions of the metallization pattern 110 exposed by the openings 114. In some embodiments, the seed layer 116A is a metal layer, which may be a single layer or a composite layer comprising a plurality of sub-layers formed of different materials. In a particular embodiment, the seed layer 116A comprises a titanium layer and a copper layer over the titanium layer. The seed layer 116A may be formed using, for example, PVD or the like. The seed layer 116A is formed to a thickness $T_1$, which can be in the range of about 0.5 µm to about 0.8 µm. A photoresist 118 is then formed and patterned on the seed layer 116A. The photoresist 118 may be formed by spin coating or the like and may be exposed to light for patterning. The pattern of the photoresist 118 corresponds to the through vias 116. The patterning forms openings 120 through the photoresist 118 to expose the seed layer 116A.

Figure 5B:
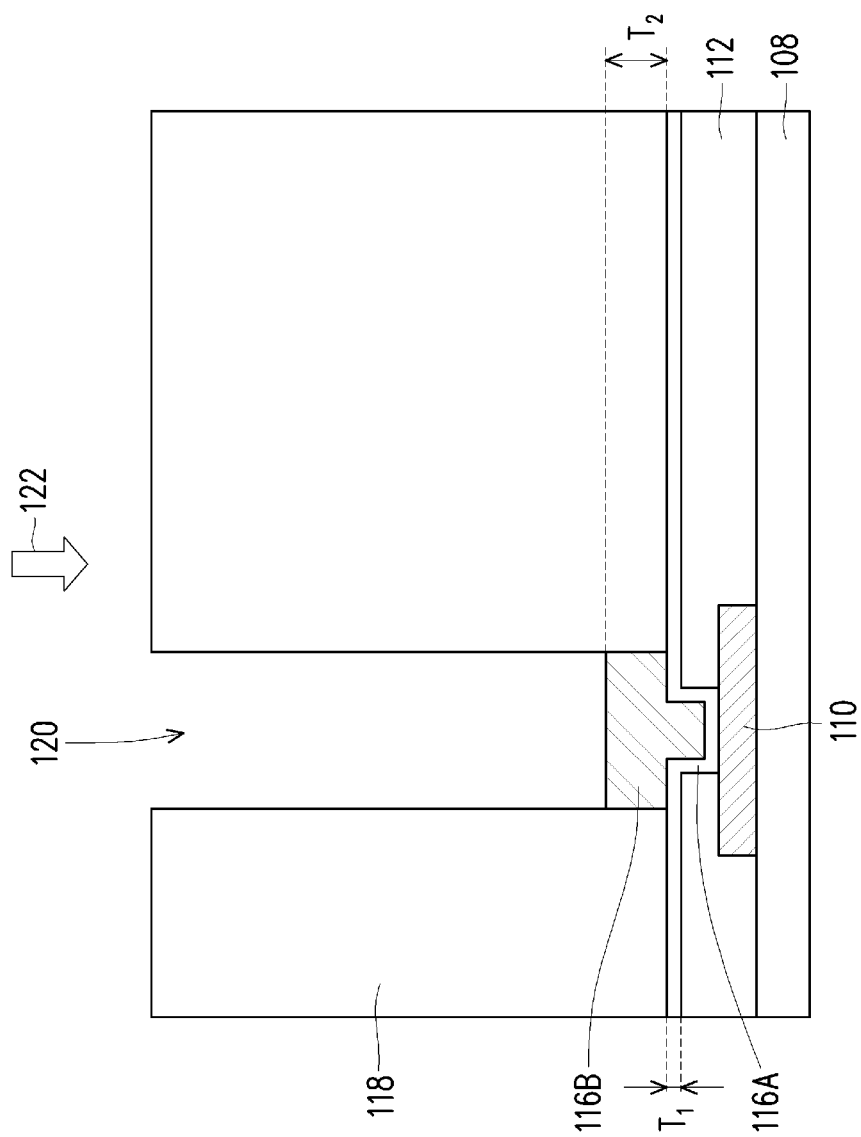

In FIG. 5B, a first plating process 122 is performed to form first conductive material layers 116B in the openings 120 of the photoresist 118 and on the exposed portions of the seed layer 116A. The first conductive material layers 116B may comprise a metal, like copper, titanium, tungsten, aluminum, or the like. The first plating process 122 is an electroplating process performed with a first set of plating process parameters.

The first plating process 122 is performed using a plating current density small enough so that the respective first conductive material layers 116B are plated conformally in the openings 114. For example, the plating current density of the first plating process 122 can be in the range of about 5 A/dm$^2$ to about 10 A/dm$^2$. Increasing the conformality of the first plating process 122 helps the first conductive material layers 116B properly adhere to the seed layer 116A, thus reducing the chances of peeling. For example, when copper is plated, a low initial plating current density allows for a more stable copper-ion deposition rate, which allows for denser first conductive material layers 116B. The plating current density affects the plating speed, and as such, the first plating process 122 has a low plating rate. The first plating process 122 is performed until the portions of the first conductive material layers 116B outside of the openings 114 are a desired thickness $T_2$. For example, the thickness $T_2$ can be in the range of about 5 µm to about 10 µm, which can be obtained by performing the first plating process 122 for a duration in the range of about 30 seconds to about 90 seconds. The thickness $T_2$ of the first conductive material layers 116B is greater than the thickness $T_1$ of the seed layer 116A.

Figure 5C:
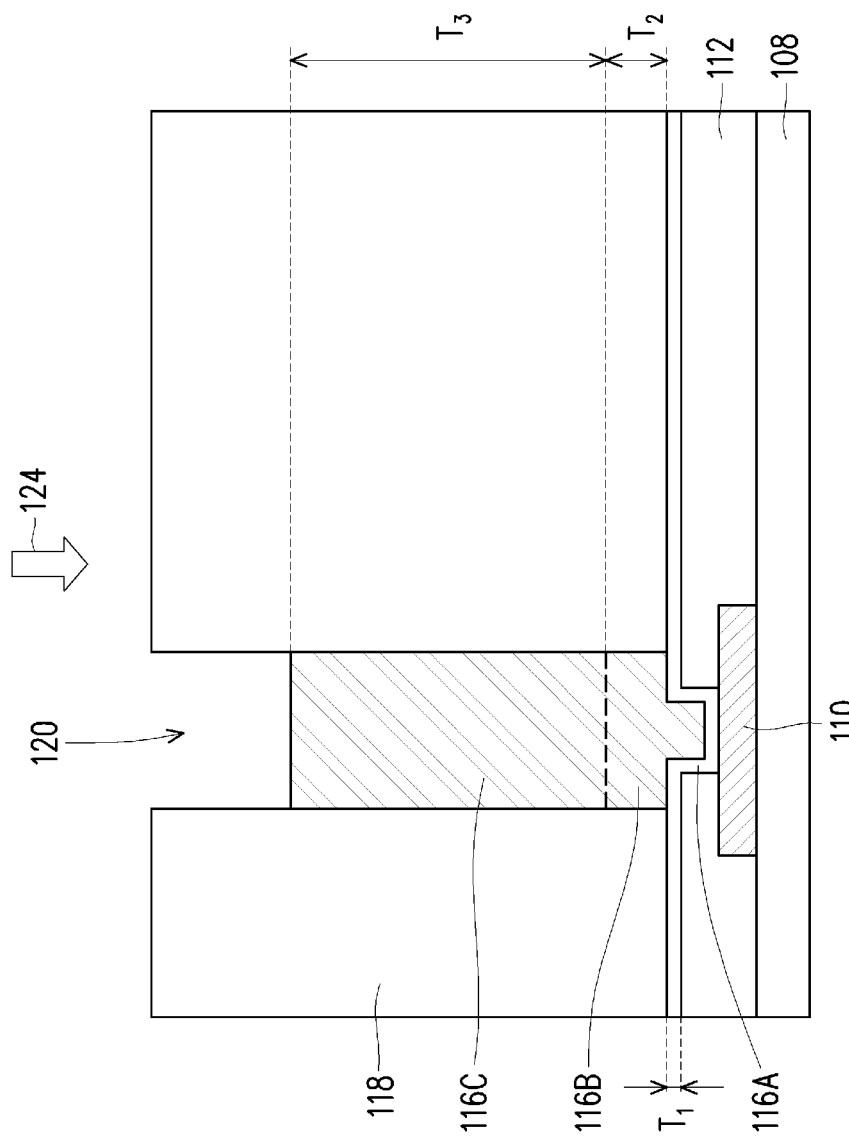

In FIG. 5C, a second plating process 124 is performed to form second conductive material layers 116C in the openings 120 of the photoresist 118 and on the first conductive material layers 116B. The second conductive material layers 116C may comprise a metal, like copper, titanium, tungsten, aluminum, or the like. In some embodiments, the second conductive material layers 116C are the same conductive material as the first conductive material layers 116B. The second plating process 124 is an electroplating process performed with a second set of plating process parameters.

The second plating process 124 is performed using a plating current density large enough so that the respective second conductive material layers 116C are plated at an acceptable rate. For example, the plating current density of the second plating process 124 can be in the range of about 15 A/dm² to about 22 A/dm². Increasing the plating current density of the second plating process 124 helps the second conductive material layers 116C be formed in a low amount of time, reducing the manufacturing costs of the first package component 100. The plating current density affects the plating speed, and as such, the second plating process 124 has a high plating rate. Notably, the plating current density of the second plating process 124 is greater than the plating current density of the first plating process 122. The second plating process 124 is performed until the second conductive material layers 116C are a desired thickness $T_3$. For example, the thickness $T_3$ can be in the range of about 150 μm to about 200 μm, which can be obtained by performing the second plating process 124 for a duration in the range of about 1200 seconds to about 2400 seconds. The thickness $T_3$ of the second conductive material layers 116C is greater than the thickness $T_2$ of the first conductive material layers 116B and the thickness $T_1$ of the seed layer 116A.

Figure 5D:
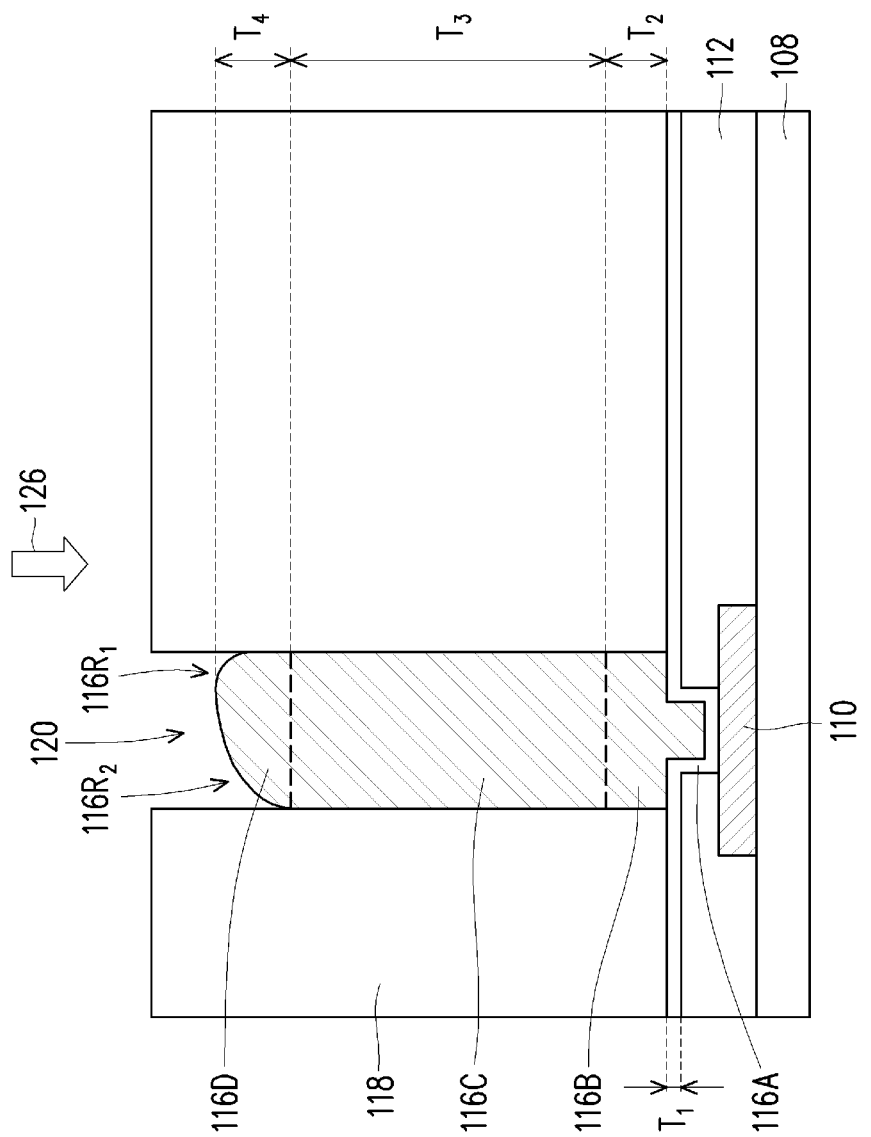

In FIG. 5D, a third plating process 126 is performed to form third conductive material layers 116D in the openings 120 of the photoresist 118 and on the second conductive material layers 116C. The third conductive material layers 116D may comprise a metal, like copper, titanium, tungsten, aluminum, or the like. In some embodiments, the third conductive material layers 116D are the same conductive material as the first conductive material layers 116B and the second conductive material layers 116C.

The third plating process 126 is an electroplating process performed with a third set of plating process parameters. The third plating process 126 is performed using a plating current density large enough so that the respective plated third conductive material layers 116D have convex topmost surfaces. For example, the plating current density of the third plating process 126 can be in the range of about 20 A/dm² to about 30 A/dm². Increasing the plating current density of the third plating process 126 reduces the plating conformality of the third plating process 126. For example, when copper is plated, a high plating current density allows for a greater copper-ion deposition rate, which allows for more porous third conductive material layers 116D. The third conductive material layers 116D thus have a lesser density than the first conductive material layers 116B. The plating current density affects the plating speed, and as such, the third plating process 126 has a high plating rate. Notably, the plating current density of the third plating process 126 is greater than the plating current density of the second plating process 124. The third plating process 126 is performed until the third conductive material layers 116D are a desired thickness $T_4$. For example, the thickness $T_4$ can be in the range of about 30 μm to about 50 μm, which can be obtained by performing the third plating process 126 for a duration in the range of about 900 seconds to about 1200 seconds. The thickness $T_4$ of the third conductive material layers 116D is less than the thickness $T_3$ of the second conductive material layers 116C, is greater than the thickness $T_2$ of the first conductive material layers 116B, and is greater than the thickness $T_1$ of the seed layer 116A.

As a result of the non-conformal third plating process 126, the sidewalls of the third conductive material layers 116D taper to meet the topmost surfaces of the third conductive material layers 116D. The widths of the through vias 116 decrease continuously and non-linearly in a direction extending from the bottoms of the third conductive material layers 116D to the topmost surfaces of the third conductive material layers 116D, thus forming convex topmost surfaces. In some embodiments, all of the sidewalls of the third conductive material layers 116D are tapered. In some embodiments, only some portions of the sidewalls of the third conductive material layers 116D are tapered, and remaining portions of the sidewalls of the third conductive material layers 116D are straight. As discussed below, forming the third conductive material layers 116D with convex topmost surfaces helps avoid defects during subsequent planarization process(es).

In some embodiments, the first package component 100 is not level during the third plating process 126. For example, during the third plating process 126, the first package component 100 may be submerged in the plating solution from one side, e.g., with the carrier substrate 102 vertically oriented. Due to gravitational forces, the third conductive material layers 116D may be asymmetrically plated, e.g., may be plated at different rates. In particular, after submersion, some corner regions $116R_1$ face towards the ground (e.g., in the direction of gravitational forces), and opposing corner regions $116R_2$ face away from the ground (e.g., away from the direction of gravitational forces). More conductive material may be plated in the corner regions $116R_1$ facing the ground than in the corner regions $116R_2$ facing away from the ground. During plating, copper ions concentrate in the direction of gravitation forces, e.g., in the corner regions $116R_1$ facing the ground. When additional copper ions are formed during plating, they are attracted to the existing copper ions in the corner regions $116R_1$. Thus, the corner regions $116R_1$ facing the ground may thus have a less rounded profile than the corner regions $116R_2$ facing away from the ground.

Figure 5E:
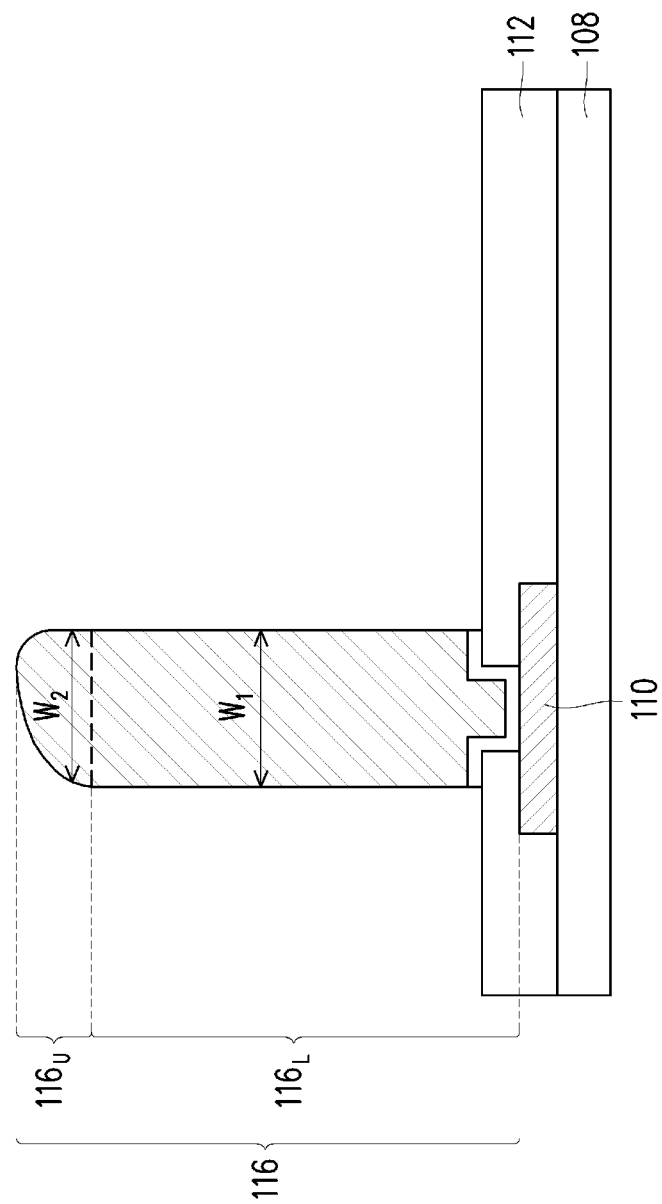

In FIG. 5E, the photoresist 118 and portions of the seed layer 116A on which the conductive material is not formed are removed. The photoresist 118 may be removed by an acceptable ashing or stripping process, such as using an oxygen plasma or the like. Once the photoresist 118 is removed, exposed portions of the seed layer 116A are removed, such as by using an acceptable etching process, such as by wet or dry etching. The remaining portions of the seed layer 116A and the conductive material layers 116B, 116C, and 116D (see FIG. 5D) form the through vias 116. The resulting through vias 116 have lower portions $116_L$ with straight sidewalls having constant widths $W_1$, and tapered upper portions $116_U$ with continuously and non-linearly decreasing widths $W_2$. In other words, the upper portions $116_U$ have non-linear tapers. The widths $W_1$ can be in the range of about 150 μm to about 240 μm. Likewise, the widths $W_2$ can decrease in a non-linear manner from the width $W_1$ to a width of substantially nothing at the apexes of the through vias 116. The tapered upper portions $116_U$ are formed from some or all of the third conductive material layers 116D (see FIG. 5D).

Figure 6:
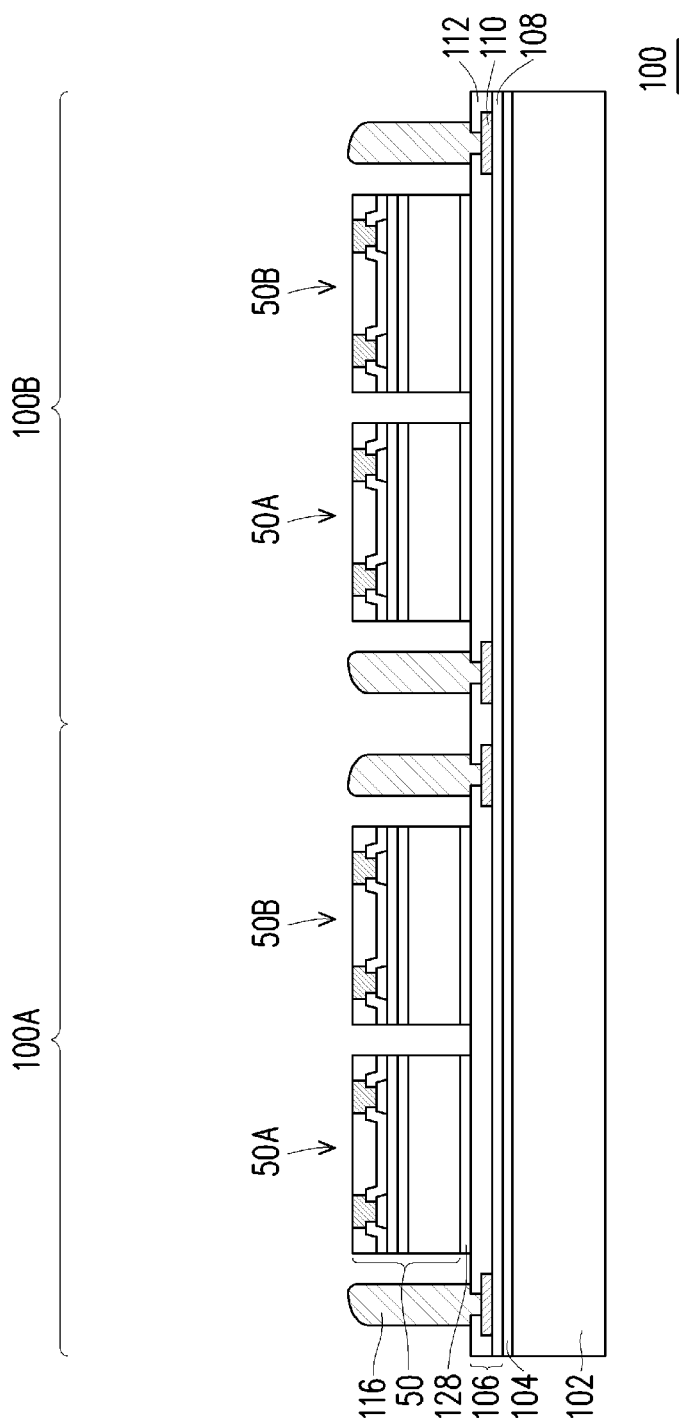

In FIG. 6, integrated circuit dies 50 are adhered to the dielectric layer 112 by an adhesive 128. A desired type and quantity of integrated circuit dies 50 are adhered in each of the package regions 100A and 100B. In the embodiment shown, multiple integrated circuit dies 50 are adhered adjacent one another, including a first integrated circuit die 50A and a second integrated circuit die 50B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the package regions 100A and 100B may be limited, particularly when the integrated circuit dies 50A and 50B include devices with a large footprint, such as SoCs. Use of the back-side redistribution structure 106 allows for an improved interconnect arrangement when the package regions 100A and 100B have limited space available for the through vias 116.

The adhesive 128 is on back-sides of the integrated circuit dies 50A and 50B and adheres the integrated circuit dies 50A and 50B to the back-side redistribution structure 106, such as to the dielectric layer 112. The adhesive 128 may be any suitable adhesive, epoxy, die attach film (DAF), or the like. The adhesive 128 may be applied to back-sides of the integrated circuit dies 50A and 50B or may be applied over the surface of the carrier substrate 102. For example, the adhesive 128 may be applied to the back-sides of the integrated circuit dies 50A and 50B before singulating to separate the integrated circuit dies 50A and 50B.

Figure 7:
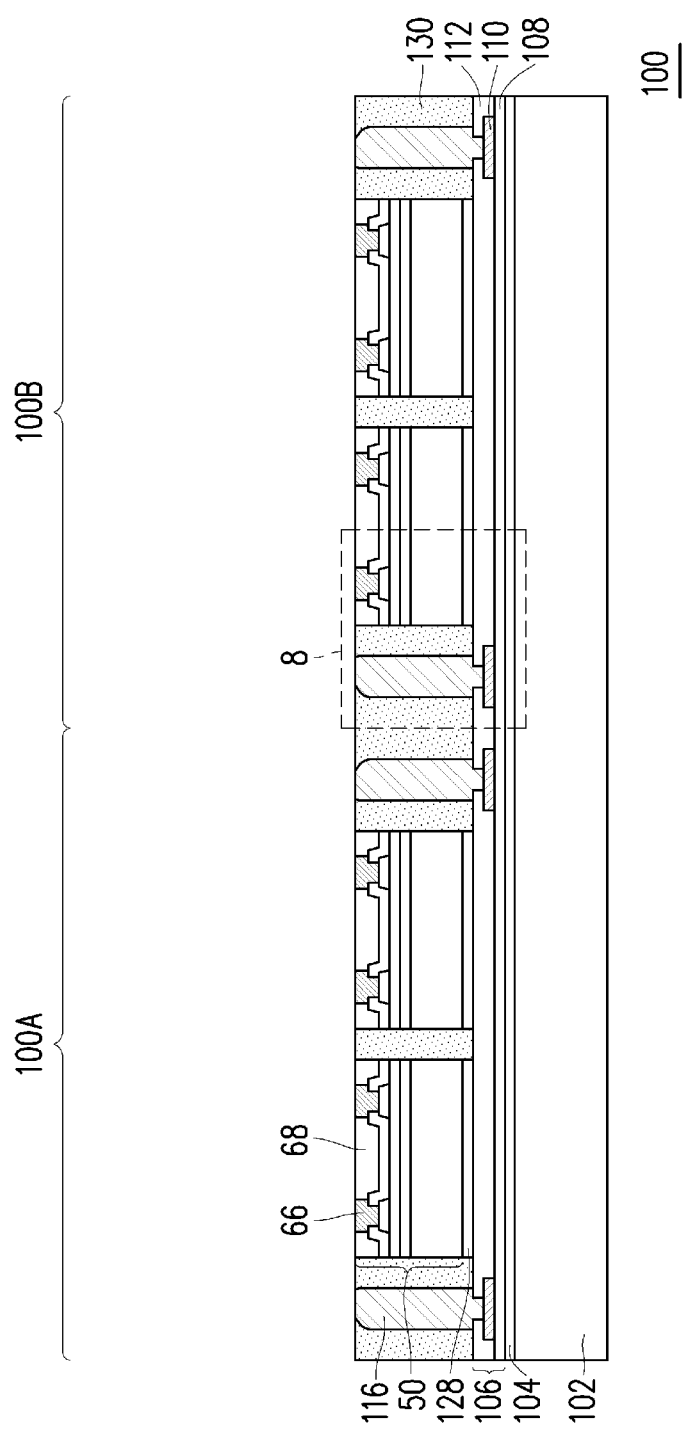
Figure 8A:
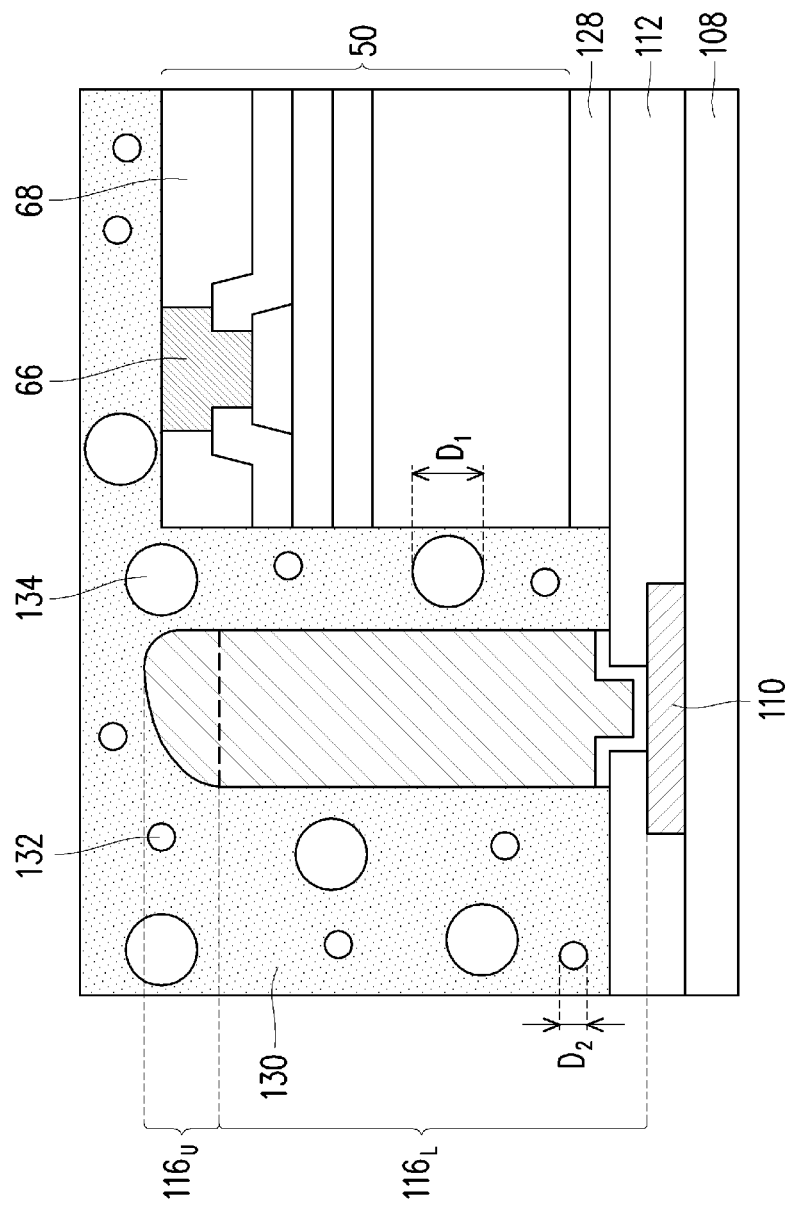
Figure 8B:
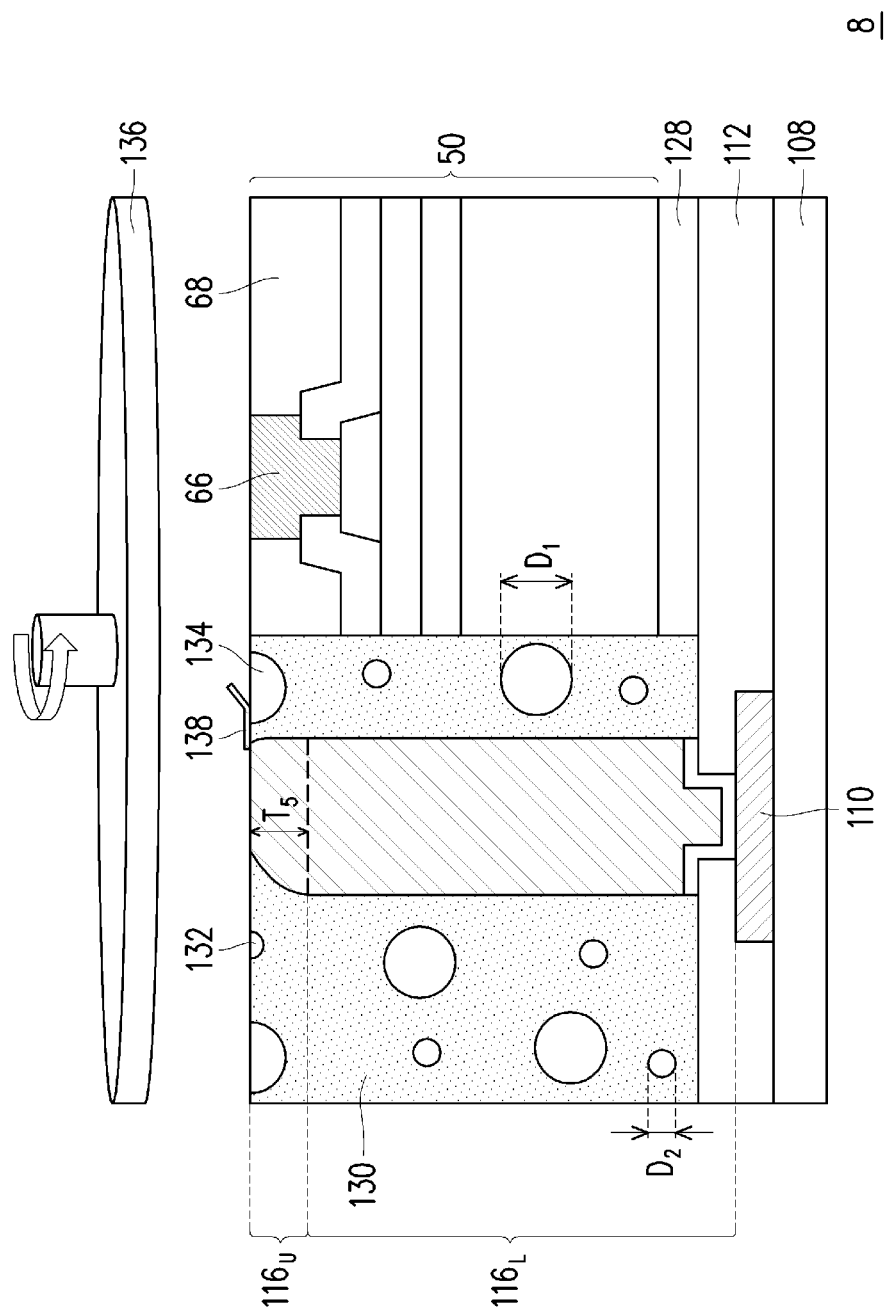

In FIG. 7, an encapsulant 130 is formed on and around the various components. After formation, the encapsulant 130 encapsulates the through vias 116 and integrated circuit dies 50. FIG. 8A through 8B illustrate cross-sectional views of intermediate steps during a process for forming the encapsulant 130, in accordance with some embodiments. In particular, a region 8 in FIG. 7 is shown in more detail.

In FIG. 8A, the encapsulant 130 is applied. The encapsulant 130 may be a molding compound, epoxy, or the like. The encapsulant 130 is applied by compression molding, transfer molding, or the like, and is formed over the carrier substrate 102 such that the through vias 116 and/or the integrated circuit dies 50 are buried or covered. The encapsulant 130 is further formed in gap regions between the integrated circuit dies 50, if present. The encapsulant 130 may be applied in liquid or semi-liquid form and then subsequently cured.

The encapsulant 130 has accelerators 132 and fillers 134 dispersed therein. The accelerators 132 comprise a catalyst to accelerate the curing of the encapsulant 130, such as particles of an organophosphine. Other accelerators may also be used, such as particles of imidazole, an amine, urea derivatives, or Lewis bases and their organic salts. The fillers 134 comprise a material that provides mechanical strength and thermal dispersion for the encapsulant 130, such as particles of silica ($SiO_2$). The fillers 134 have a diameter $D_1$, which can be in the range of about 5 µm to about 25 µm. The fillers 134 may not all have identical diameters, but may have an average diameter $D_1$. For example, the average diameter $D_1$ can be about 8 µm. Likewise, the accelerators 132 have a diameter $D_2$, which can be in the range of about 5 µm to about 30 µm. The accelerators 132 may not all have identical diameters, but may have an average diameter $D_2$. For example, the average diameter $D_2$ can be about 10 µm. The average diameter $D_2$ of the accelerators 132 may be greater than the average diameter $D_1$ of the fillers 134.

In FIG. 8B, a planarization process is performed on the encapsulant 130 to expose the through vias 116 and the die connectors 66. The planarization process also removes material of the through vias 116, dielectric layer 68, and/or die connectors 66 until the die connectors 66 and through vias 116 are exposed. Topmost surfaces of the through vias 116, die connectors 66, dielectric layer 68, and encapsulant 130 are coplanar after the planarization process. The planarization process may be, for example, a chemical-mechanical polish (CMP).

During the CMP, the die connectors 66, dielectric layer 68, through vias 116, encapsulant 130, accelerators 132, and fillers 134 are ground by a polishing pad 136 applied with a downward force. Because the encapsulant 130 and through vias 116 are formed from differing materials, the downward force of the polishing pad 136 may be unevenly distributed across the ground surfaces. For example, dishing may occur such that surfaces of the encapsulant 130 are ground further than surfaces of the through vias 116. Due to dishing, portions of the encapsulant 130 proximate the through vias 116 may be ground with a greater downward force than portions of the encapsulant 130 distal the through vias 116. Such an uneven force distribution can cause ground fillers 134 proximate the through vias 116 to be dug out of the encapsulant 130. For example, ground fillers 134 within a distance of about 2 µm to about 25 µm of the through vias 116 may be dug out when the CMP is performed with an uneven force distribution. When fillers 134 are dug out, voids are formed in the encapsulant 130, reducing the mechanical stability of the first package component 100. The convex topmost surfaces and tapering widths of the upper portions $116_U$ of the through vias 116 reduce the amount of conductive material ground during the CMP, thus reducing dishing and helping redistribute forces applied to the ground surface of the encapsulant 130 during the CMP, thereby causing the downward force of the polishing pad 136 to be more evenly distributed across the ground surfaces during the CMP. As such, the formation of voids in the encapsulant 130 may be reduced or avoided. During the CMP, the upper portions $116_U$ of the through vias 116 are ground such that they are reduced to a thickness $T_5$. The remaining thickness $T_5$ is greater than 0 µm and is less than the original thickness $T_4$. For example, the remaining thickness $T_5$ can be in the range of about 8 µm to about 10 µm. Notably, the remaining thickness $T_5$ is greater than the average diameter $D_1$ of the fillers 134. A majority of the fillers 134 may thus remain buried during the CMP, thus reducing the exposed surface area of the fillers 134, which may help reduce the amount of fillers 134 that are dug out by the CMP. The lower portions $116_L$ of the through vias 116 are not ground during the CMP. For example, the grinding depth of the CMP may be selected based on the plating process parameters for the through vias 116 so that over-grinding is avoided.

When the through vias 116 are ground by the polishing pad 136, residual conductive material 138 is formed. Because the ground fillers 134 proximate the through vias 116 remain and are not dug out, the residual conductive material 138 may be removed by the polishing pad, instead of being collected in voids. As discussed further below, shorting of the through vias 116 may thus be avoided.

In FIGS. 9 through 12, a front-side redistribution structure 140 (see FIG. 12) is formed over the encapsulant 130, through vias 116, and integrated circuit dies 50. The front-side redistribution structure 140 includes dielectric layers 142, 146, 150, and 154; and metallization patterns 144, 148, and 152. The metallization patterns may also be referred to as redistribution layers or redistribution lines. The front-side redistribution structure 140 is shown as an example having three layers of metallization patterns. More or fewer dielectric layers and metallization patterns may be formed in the front-side redistribution structure 140. If fewer dielectric layers and metallization patterns are to be formed, steps and process discussed below may be omitted. If more dielectric layers and metallization patterns are to be formed, steps and processes discussed below may be repeated.

Figure 9:
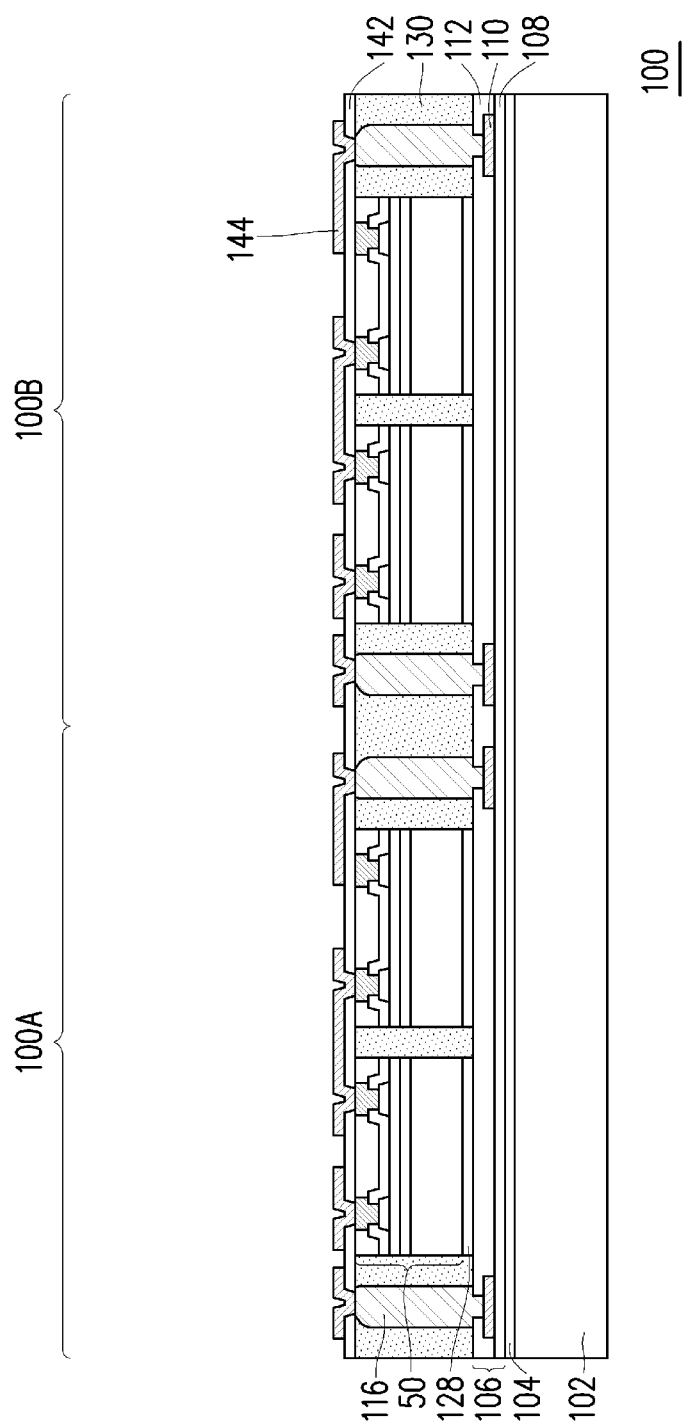

In FIG. 9, the dielectric layer 142 is deposited on the encapsulant 130, through vias 116, and die connectors 66. In some embodiments, the dielectric layer 142 is formed of a photo-sensitive material such as PBO, polyimide, BCB, or the like, which may be patterned using a lithography mask. The dielectric layer 142 may be formed by spin coating, lamination, CVD, the like, or a combination thereof. The dielectric layer 142 is then patterned. The patterning forms openings exposing portions of the through vias 116 and the die connectors 66. The patterning may be by an acceptable process, such as by exposing the dielectric layer 142 to light when the dielectric layer 142 is a photo-sensitive material or by etching using, for example, an anisotropic etch. If the dielectric layer 142 is a photo-sensitive material, the dielectric layer 142 can be developed after the exposure.

The metallization pattern 144 is then formed. The metallization pattern 144 includes line portions (also referred to as conductive lines) on and extending along the major surface of the dielectric layer 142. The metallization pattern 144 further includes via portions (also referred to as conductive vias) extending through the dielectric layer 142 to physically and electrically couple the through vias 116 and the integrated circuit dies 50. As an example to form the metallization pattern 144, a seed layer is formed over the dielectric layer 142 and in the openings extending through the dielectric layer 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 144. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 144. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

As noted above, the residual conductive material 138 (see FIG. 8B) from the ground through vias 116 may collect in voids formed in the encapsulant 130 during planarization. The residual conductive material 138 is large enough to penetrate through the dielectric layer 142, e.g., the length of the residual conductive material 138 may exceed the thickness of the dielectric layer 142. The residual conductive material 138 that penetrates the dielectric layer 142 may electrically bridge the through vias 116 to undesired features of the metallization pattern 144. Avoiding the formation of voids in the encapsulant 130 reduces the amount of residual conductive material 138 remaining beneath the dielectric layer 142, and may thus reduce the chances of shorting the through vias 116, improving the manufacturing yield for the first package component 100.

Figure 10:
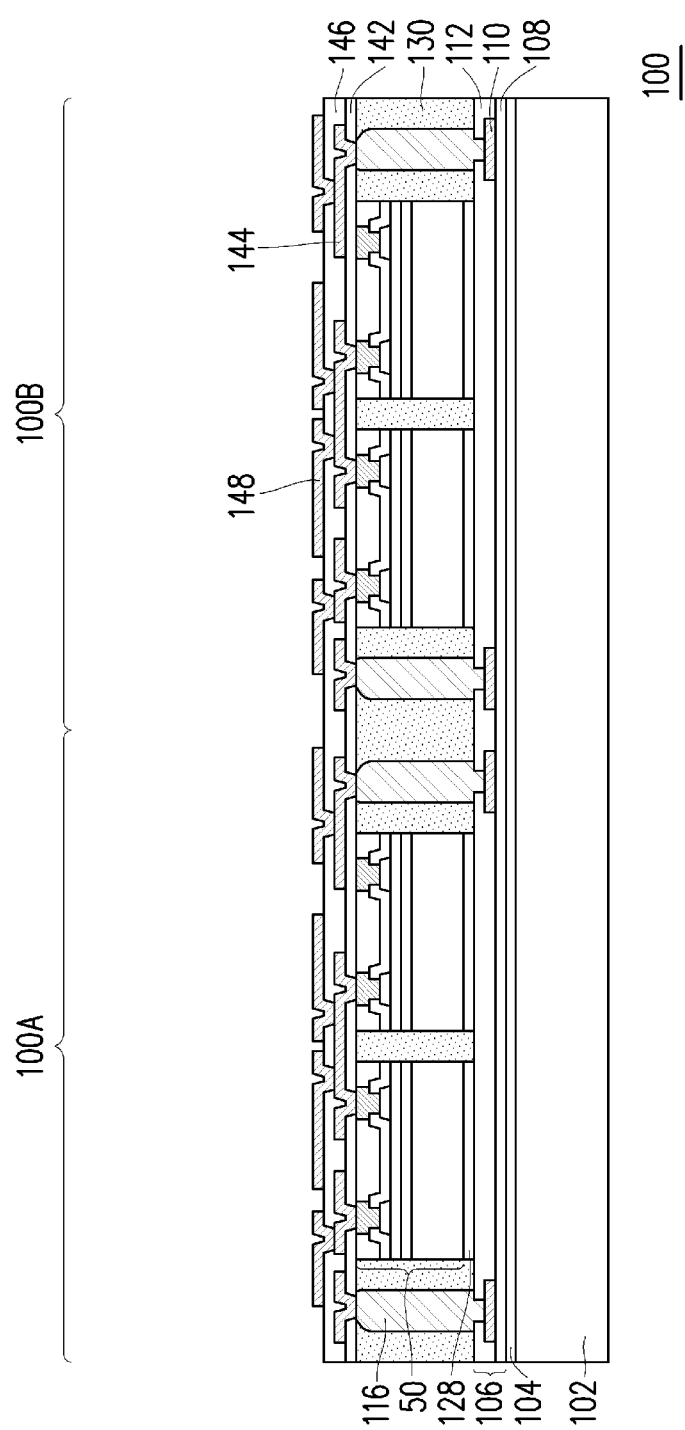

In FIG. 10, the dielectric layer 146 is deposited on the metallization pattern 144 and dielectric layer 142. The dielectric layer 146 may be formed in a manner similar to the dielectric layer 142, and may be formed of a similar material as the dielectric layer 142.

The metallization pattern 148 is then formed. The metallization pattern 148 includes line portions on and extending along the major surface of the dielectric layer 146. The metallization pattern 148 further includes via portions extending through the dielectric layer 146 to physically and electrically couple the metallization pattern 144. The metallization pattern 148 may be formed in a similar manner and of a similar material as the metallization pattern 144. In some embodiments, the metallization pattern 148 has a different size than the metallization pattern 144. For example, the conductive lines and/or vias of the metallization pattern 148 may be wider or thicker than the conductive lines and/or vias of the metallization pattern 144. Further, the metallization pattern 148 may be formed to a greater pitch than the metallization pattern 144.

Figure 11:
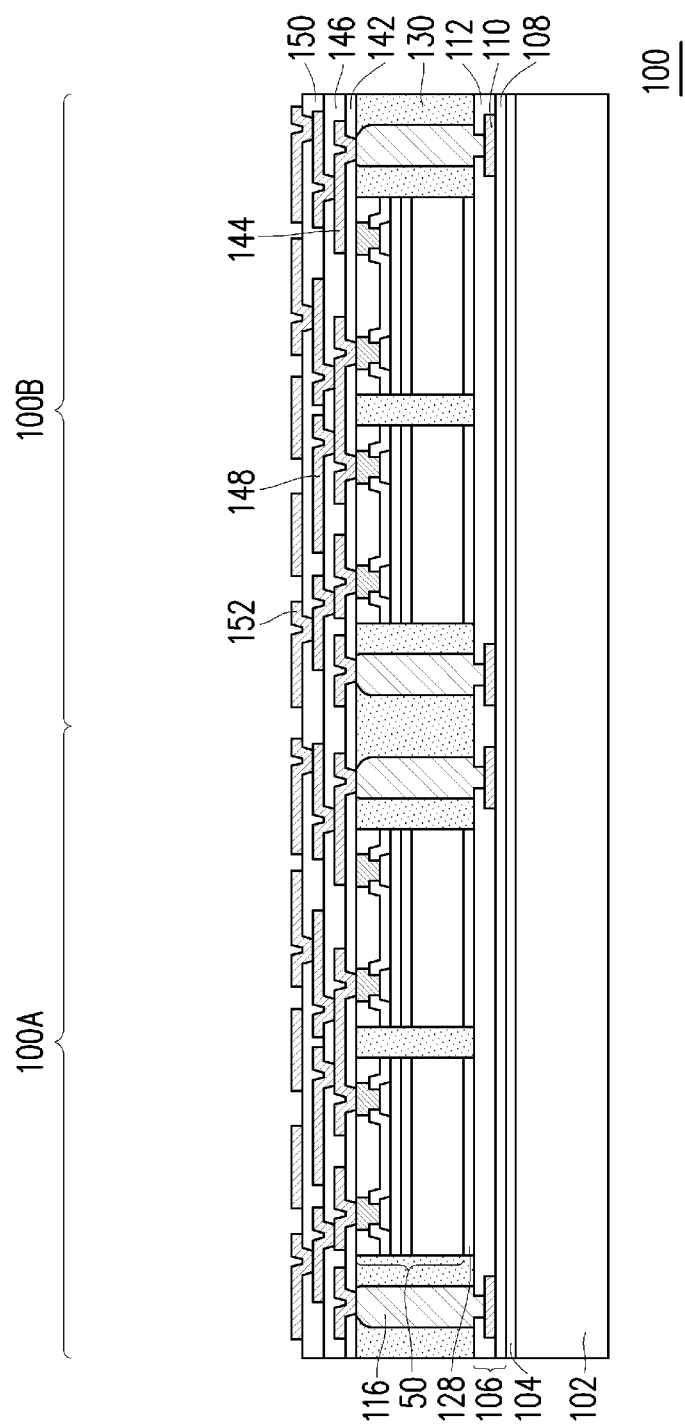

In FIG. 11, the dielectric layer 150 is deposited on the metallization pattern 148 and dielectric layer 146. The dielectric layer 150 may be formed in a manner similar to the dielectric layer 142, and may be formed of a similar material as the dielectric layer 142.

The metallization pattern 152 is then formed. The metallization pattern 152 includes line portions on and extending along the major surface of the dielectric layer 150. The metallization pattern 152 further includes via portions extending through the dielectric layer 150 to physically and electrically couple the metallization pattern 148. The metallization pattern 152 may be formed in a similar manner and of a similar material as the metallization pattern 144. The metallization pattern 152 is the topmost metallization pattern of the front-side redistribution structure 140. As such, all of the intermediate metallization patterns of the front-side redistribution structure 140 (e.g., the metallization patterns 144 and 148) are disposed between the metallization pattern 152 and the integrated circuit dies 50. In some embodiments, the metallization pattern 152 has a different size than the metallization patterns 144 and 148. For example, the conductive lines and/or vias of the metallization pattern 152 may be wider or thicker than the conductive lines and/or vias of the metallization patterns 144 and 148. Further, the metallization pattern 152 may be formed to a greater pitch than the metallization pattern 148.

Figure 12:
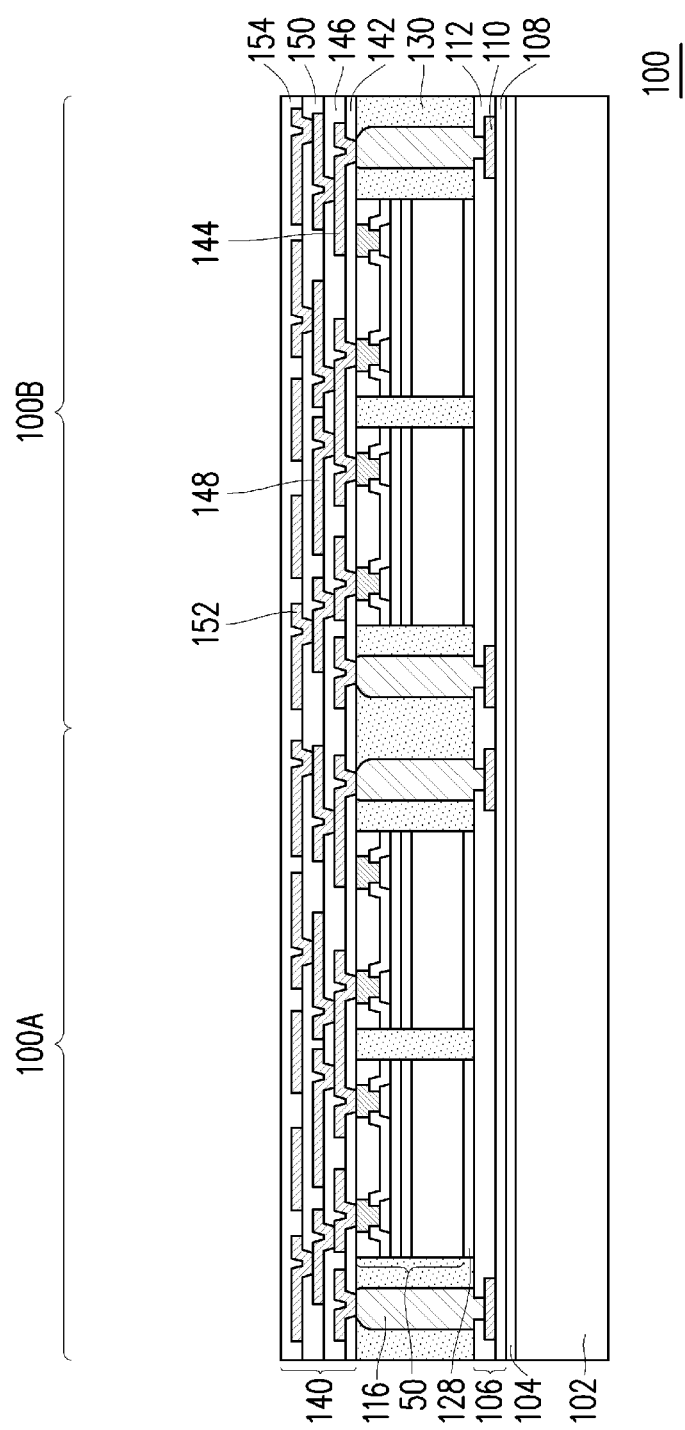

In FIG. 12, the dielectric layer 154 is deposited on the metallization pattern 152 and dielectric layer 150. The dielectric layer 154 may be formed in a manner similar to the dielectric layer 142, and may be formed of the same material as the dielectric layer 142. The dielectric layer 154 is the topmost dielectric layer of the front-side redistribution structure 140. As such, all of the metallization patterns of the front-side redistribution structure 140 (e.g., the metallization patterns 144, 148, and 152) are disposed between the dielectric layer 154 and the integrated circuit dies 50. Further, all of the intermediate dielectric layers of the front-side redistribution structure 140 (e.g., the dielectric layers 142, 146, 150) are disposed between the dielectric layer 154 and the integrated circuit dies 50.

Figure 13:
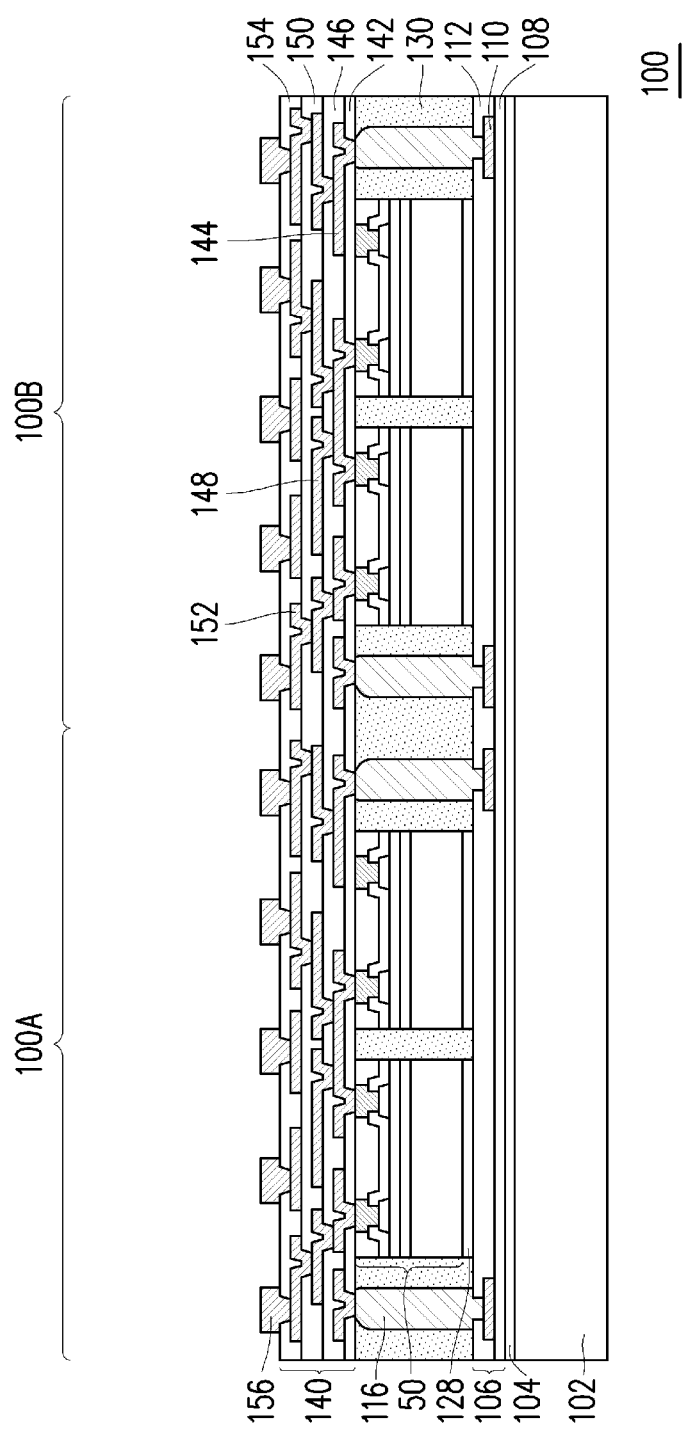

In FIG. 13, under-bump metallurgies (UBMs) 156 are formed for external connection to the front-side redistribution structure 140. The UBMs 156 have bump portions on and extending along the major surface of the dielectric layer 154, and have via portions extending through the dielectric layer 154 to physically and electrically couple the metallization pattern 152. As a result, the UBMs 156 are electrically coupled to the through vias 116 and the integrated circuit dies 50. The UBMs 156 may be formed of the same material as the metallization pattern 144. In some embodiments, the UBMs 156 has a different size than the metallization patterns 144, 148, and 152.

Figure 14:
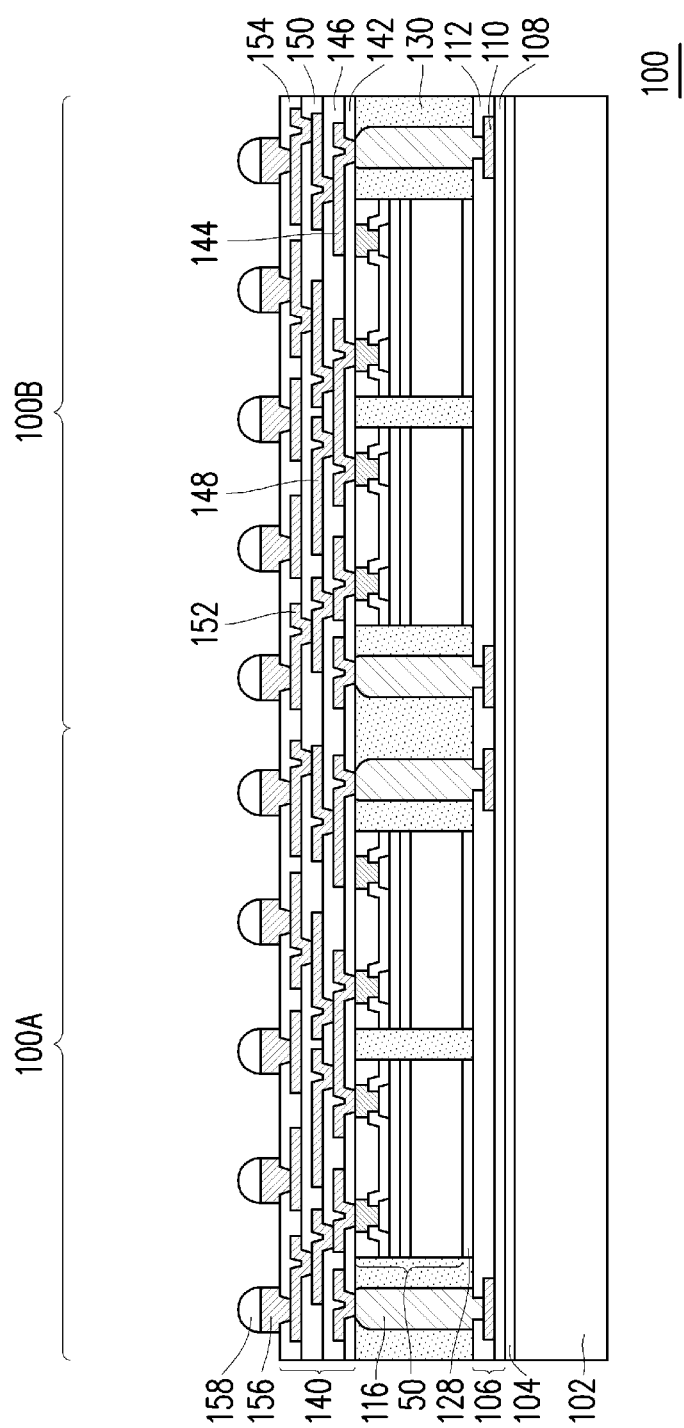

In FIG. 14, conductive connectors 158 are formed on the UBMs 156. The conductive connectors 158 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 158 may include a conductive material such as solder, copper, aluminum, gold, nickel, silver, palladium, tin, the like, or a combination thereof. In some embodiments, the conductive connectors 158 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 158 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 15:
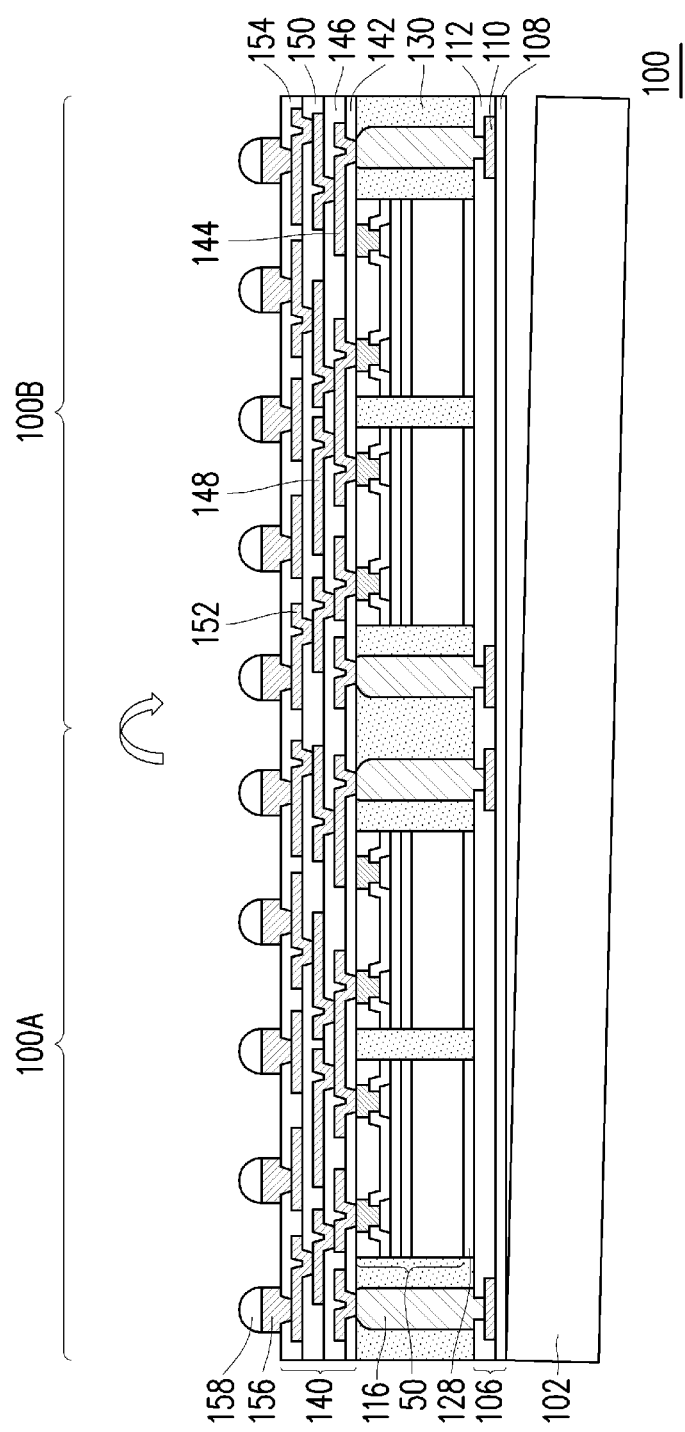

In FIG. 15, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 16:
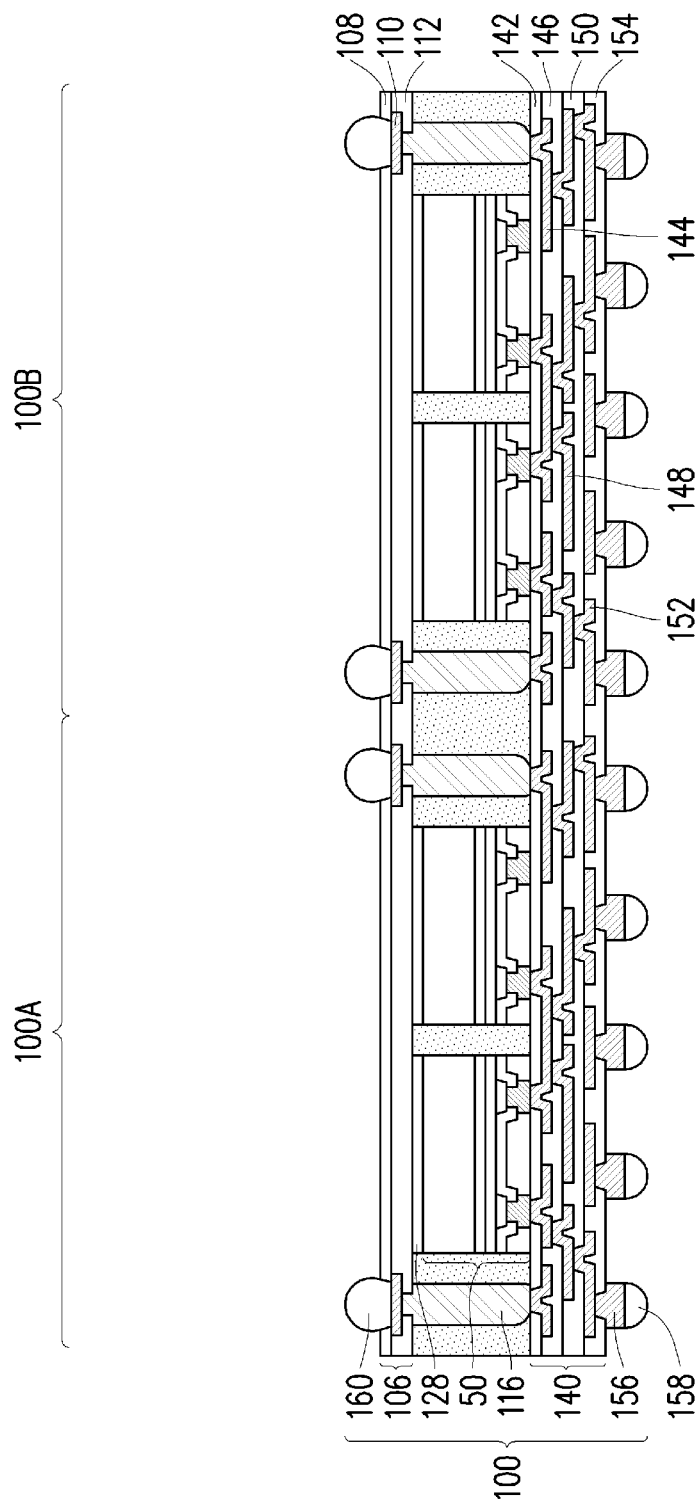

In FIG. 16, conductive connectors 160 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 160 are formed in the openings. In some embodiments, the conductive connectors 160 comprise flux and are formed in a flux dipping process. In some embodiments, the conductive connectors 160 comprise a conductive paste such as solder paste, silver paste, or the like, and are dispensed in a printing process. In some embodiments, the conductive connectors 160 are formed in a manner similar to the conductive connectors 158, and may be formed of a similar material as the conductive connectors 158.

Figure 17:
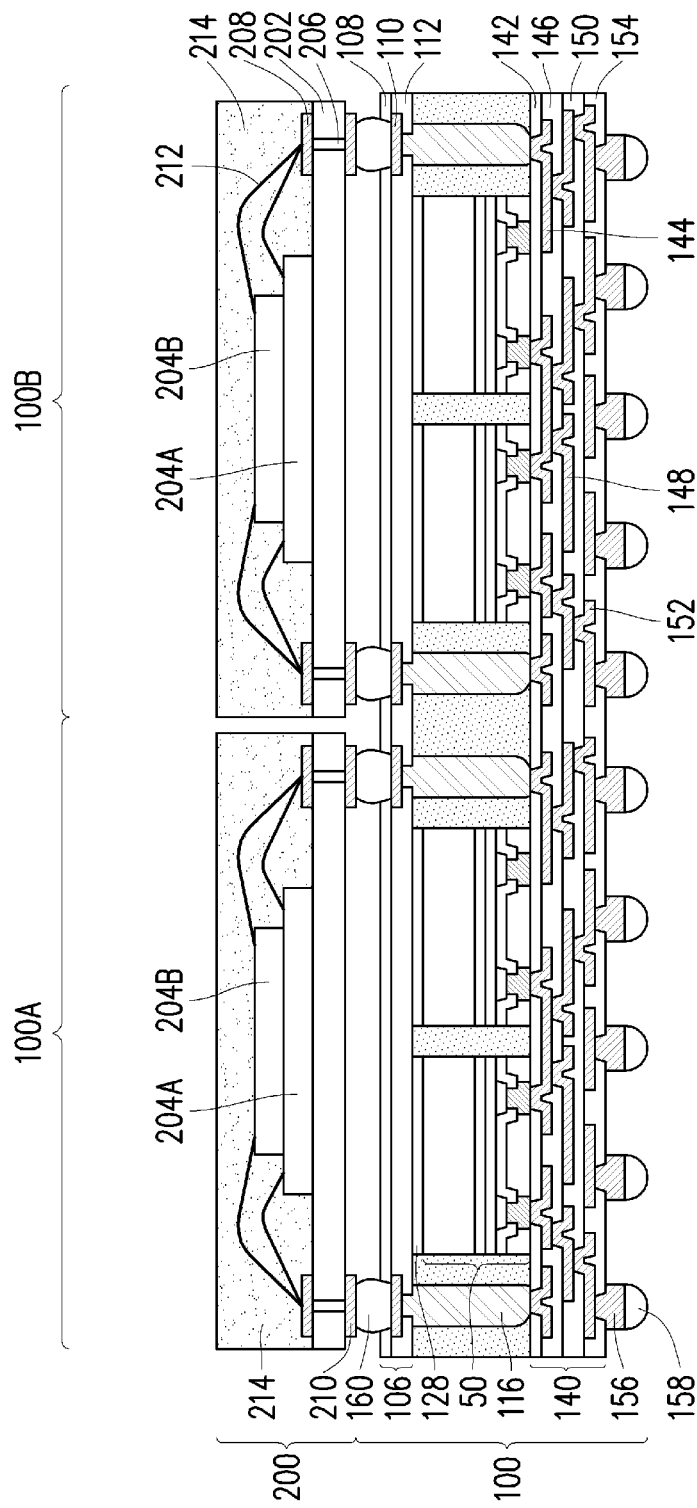
FIGS. 17 and 18 illustrate formation and implementation of device stacks, in accordance with some embodiments.
Figure 18:
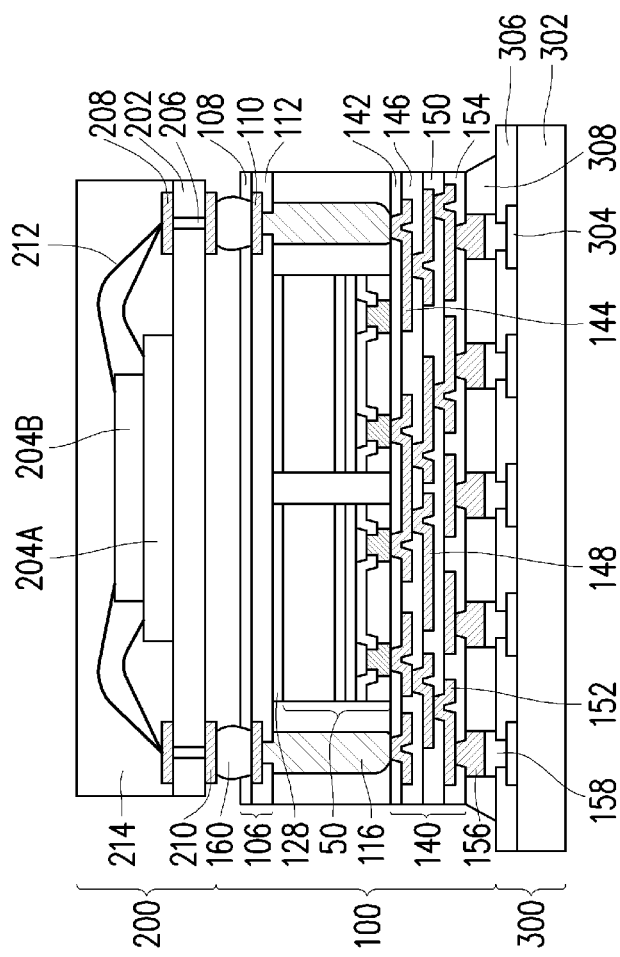

FIGS. 17 and 18 illustrate formation and implementation of device stacks, in accordance with some embodiments. The device stacks are formed from the integrated circuit packages formed in the first package component 100. The device stacks may also be referred to as package-on-package (POP) structures.

In FIG. 17, second package components 200 are coupled to the first package component 100. One of the second package components 200 are coupled in each of the package regions 100A and 100B to form an integrated circuit device stack in each region of the first package component 100.

The second package components 200 include a substrate 202 and one or more dies coupled to the substrate 202. In the illustrated embodiment, the dies include stacked dies 204A and 204B. In some embodiments, the dies (or die stacks) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 206. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 208 on a first side of the substrate 202 to couple to the stacked dies 204A and 204B, and bond pads 210 on a second side of the substrate 202, the second side being opposite the first side of the substrate 202, to couple to the conductive connectors 160. In some embodiments, the bond pads 208 and 210 are formed by forming recesses into dielectric layers on the first and second sides of the substrate 202. The recesses may be formed to allow the bond pads 208 and 210 to be embedded into the dielectric layers. In other embodiments, the recesses are omitted as the bond pads 208 and 210 may be formed on the dielectric layer. In some embodiments, the bond pads 208 and 210 include a thin seed layer made of copper, titanium, nickel, gold, palladium, the like, or a combination thereof. The conductive material of the bond pads 208 and 210 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 208 and 210 is copper, tungsten, aluminum, silver, gold, the like, or a combination thereof.

In an embodiment, the bond pads 208 and 210 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 208 and 210. Any suitable materials or layers of material that may be used for the bond pads 208 and 210 are fully intended to be included within the scope of the current application. In some embodiments, the conductive vias 206 extend through the substrate 202 and couple at least one of the bond pads 208 to at least one of the bond pads 210.

In the illustrated embodiment, the stacked dies 204A and 204B are coupled to the substrate 202 by wire bonds 212, although other connections may be used, such as conductive bumps. In an embodiment, the stacked dies 204A and 204B are stacked memory dies. For example, the stacked dies 204A and 204B may be memory dies such as low-power (LP) double data rate (DDR) memory modules, such as LPDDR1, LPDDR2, LPDDR3, LPDDR4, or the like memory modules.

The stacked dies 204A and 204B and the wire bonds 212 may be encapsulated by a molding material 214. The molding material 214 may be molded on the stacked dies 204A and 204B and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 204A and 204B and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 160, the bond pads 208 and 210, and a metallization pattern of the back-side redistribution structure 106. In some embodiments, the stacked dies 204A and 204B may be coupled to the integrated circuit dies 50 through the wire bonds 212, the bond pads 208 and 210, conductive vias 206, the conductive connectors 160, the back-side redistribution structure 106, the through vias 116, and the front-side redistribution structure 140.

In some embodiments, a solder resist is formed on the side of the substrate 202 opposing the stacked dies 204A and 204B. The conductive connectors 160 may be disposed in openings in the solder resist to be electrically and mechanically coupled to conductive features (e.g., the bond pads 210) in the substrate 202. The solder resist may be used to protect areas of the substrate 202 from external damage.

In some embodiments, the conductive connectors 160 have an epoxy flux formed thereon before they are reflowed with at least some of the epoxy portion of the epoxy flux remaining after the second package components 200 are attached to the first package component 100.

In some embodiments, an underfill is formed between the first package component 100 and the second package components 200, surrounding the conductive connectors 160. The underfill may reduce stress and protect the joints resulting from the reflowing of the conductive connectors 160. The underfill may be formed by a capillary flow process after the second package components 200 are attached, or may be formed by a suitable deposition method before the second package components 200 are attached. In embodiments where the epoxy flux is formed, it may act as the underfill.

In FIG. 18, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In the illustrated embodiment, the singulation process is performed after the second package components 200 are coupled to the first package component 100. In other embodiments, the singulation process is performed before the second package components 200 are coupled to the first package component 100, such as after the carrier substrate 102 is de-bonded and the conductive connectors 160 are formed.

Each integrated circuit package singulated from the first package component 100 is then mounted to a package substrate 300 using the conductive connectors 158. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 158 are reflowed to attach the first package component 100 to the bond pads 304. The conductive connectors 158 electrically and/or physically couple the package substrate 300, including metallization layers in the substrate core 302, to the first package component 100. In some embodiments, a solder resist 306 is formed on the substrate core 302. The conductive connectors 158 may be disposed in openings in the solder resist 306 to be electrically and mechanically coupled to the bond pads 304. The solder resist 306 may be used to protect areas of the package substrate 300 from external damage.

The conductive connectors 158 may have an epoxy flux formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 158. In some embodiments, an underfill 308 may be formed between the first package component 100 and the package substrate 300 and surrounding the conductive connectors 158. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 156) or to the package substrate 300 (e.g., to the bond pads 304). For example, the passive devices may be bonded to a same surface of the first package component 100 or the package substrate 300 as the conductive connectors 158. The passive devices may be attached to the first package component 100 prior to mounting the first package component 100 on the package substrate 300, or may be attached to the package substrate 300 prior to or after mounting the first package component 100 on the package substrate 300.

It should be appreciated that the first package component 100 may be implement in other device stacks. For example, a POP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Forming the through vias 116 with three plating processes 122, 124, and 126 of successively higher plating current densities allows the conformality of the plating processes 122, 124, and 126 and the widths $W_1$ and $W_2$ (see FIGS. 5B-5E) of the resulting through vias 116 to be controlled. Plating the initial layers of the through vias 116 (e.g., the first conductive material layers 116B, see FIG. 5B) with a conformal plating process helps the first conductive material layers 116B properly adhere to the seed layer 116A, thus reducing the chances of peeling. Plating the final layers of the through vias 116 (e.g., the third conductive material layers 116D, see FIG. 5D) with a non-conformal plating process helps the third conductive material layers 116D form tapered upper portions 116$_U$ with convex topmost surfaces and continuously and non-linearly decreasing widths (see FIG. 5E). The tapered upper portions 116$_U$ of the through vias 116 help reduce or avoid the formation of voids in the encapsulant 130 during planarization process(es) for the encapsulant 130 (see FIG. 8B). The mechanical stability of the first package component 100 may thus be increased. Further, the chances of shorting the through vias 116 may be reduced, improving the manufacturing yield for the first package component 100.

In an embodiment, a device includes: an integrated circuit die; an encapsulant at least partially surrounding the integrated circuit die, the encapsulant including fillers having an average diameter; a through via extending through the encapsulant, the through via having a lower portion of a constant width and an upper portion of a continuously decreasing width, a thickness of the upper portion being greater than the average diameter of the fillers; and a redistribution structure including: a dielectric layer on the through via, the encapsulant, and the integrated circuit die; and a metallization pattern having a via portion extending through the dielectric layer and a line portion extending along the dielectric layer, the metallization pattern being electrically coupled to the through via and the integrated circuit die.

In some embodiments of the device, the upper portion of the through via has a non-linear taper in a direction extending from the lower portion of the through via towards the upper portion of the through via. In some embodiments of the device, the thickness of the upper portion of the through via is in a range of 8 μm to 10 μm. In some embodiments of the device, the upper portion of the through via has first corner regions with a first rounded profile, and second corner regions with a second rounded profile, the second rounded profile being different from the first rounded profile. In some embodiments of the device, a portion of the fillers are disposed within a first distance of the through via, the first distance being in a range of 2 μm to 25 μm. In some embodiments of the device, the encapsulant further includes accelerators having an average diameter, the average diameter of the accelerators being less than the average diameter of the fillers. In some embodiments of the device, the fillers are silica, and the accelerators are an organophosphine.

In an embodiment, a method includes: forming a first opening in a first dielectric layer, the first opening exposing a first metallization pattern; and forming a through via including: depositing a seed layer in the first opening and on portions of the first metallization pattern exposed by the first opening; plating a first conductive material layer on the seed layer with a first plating process, the first plating process being performed with a first plating current density; plating a second conductive material layer on the first conductive material layer with a second plating process, the second plating process being performed with a second plating current density, the second plating current density being greater than the first plating current density; and plating a third conductive material layer on the second conductive material layer with a third plating process, the third plating process being performed with a third plating current density, the third plating current density being greater than the second plating current density.

In some embodiments, the method further includes: placing an integrated circuit die on the first dielectric layer adjacent the through via; encapsulating the integrated circuit die and the through via with an encapsulant; and planarizing the encapsulant such that topmost surfaces of the encapsulant, the integrated circuit die, and the through via are level. In some embodiments of the method, the encapsulant includes fillers having an average diameter, where the through via has a lower portion of a constant width and an upper portion of a continuously decreasing width, and where a thickness of the upper portion is greater than the average diameter of the fillers after planarizing the through via. In some embodiments of the method, the thickness of the upper portion of the through via is in a range of 8 μm to 10 μm. In some embodiments of the method, the encapsulant further includes accelerators having an average diameter, the average diameter of the accelerators being less than the average diameter of the fillers. In some embodiments of the method, the fillers are silica, and the accelerators are an organophosphine. In some embodiments of the method, the first plating current density is in a range of 5 A/dm$^2$ to 10 A/dm$^2$, the second plating current density is in a range of 15 A/dm$^2$ to 22 A/dm$^2$, and the third plating current density is in a range of 20 A/dm$^2$ to 30 A/dm$^2$. In some embodiments of the method, a thickness of the second conductive material layer is greater than a thickness of the first conductive material layer, and where a thickness of the third conductive material layer is less than the thickness of the second conductive material layer. In some embodiments of the method, the seed layer includes a titanium layer, and where the first conductive material layer, the second conductive material layer, and the third conductive material layer include copper layers. In some embodiments of the method, plating the third conductive material layer includes plating first corner regions of the third conductive material layer at a different rate than second corner regions of the third conductive material layer.

In an embodiment, a method includes: forming a through via extending from a dielectric layer, the through via having a convex topmost surface, the through via being formed with a plurality of plating processes, each successive one of the plating processes being performed at a higher plating current density than a previous one of the plating processes; placing an integrated circuit die on the dielectric layer adjacent the through via; encapsulating the integrated circuit die and the through via with an encapsulant, the encapsulant including fillers having an average diameter; planarizing the encapsulant such that topmost surfaces of the encapsulant, the integrated circuit die, and the through via are level, where after the planarizing, remaining portions of the convex topmost surface of the through via having a first thickness, the first thickness being greater than the average diameter of the fillers; and forming a redistribution structure on the through via, the encapsulant, and the integrated circuit die, the redistribution structure electrically coupling the through via and the integrated circuit die.

In some embodiments of the method, an initial one of the plating processes is a conformal plating process, and a final one of the plating processes is a non-conformal plating process. In some embodiments of the method, the first thickness of the remaining portions of the convex topmost surface is in a range of 8 μm to 10 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    an integrated circuit die;
        a through-via disposed adjacent to the integrated circuit die, wherein the through-via comprises;
        a first portion of the through-via;
        a second portion of the through-via over the first portion of the through-via; and
        a third portion of the through-via over the second portion of the through-via, wherein a first material of the first portion of the through-via, a second material of the second portion of the through-via, and a third material of the third portion of the through-via are different from each other;
    an encapsulant surrounding each of the through-via and the integrated circuit die; and
    a redistribution structure over and electrically coupled to the through-via.

2. The device of claim 1, wherein a first sidewall of the first portion of the through-via has a non-linear taper.

3. The device of claim 1, further comprising a seed layer disposed between the third portion of the through-via and the redistribution structure.

4. The device of claim 1, wherein the first portion of the through-via has first corner regions with a first rounded profile and has second corner regions with a second rounded profile, the second rounded profile being different from the first rounded profile.

5. The device of claim 1, wherein the encapsulant comprises filler particles, and a diameter of each of the filler particles is in a range from 5 μm to 25 um.

6. The device of claim 1, wherein the first material of the first portion of the through-via is more porous than the third material of the third portion of the through-via.

7. The device of claim 6, wherein a density of the first material is smaller than a density of the second material and a density of the third material.

8. A device comprising:
    a first integrated circuit die over a first redistribution structure;
    a second redistribution structure over the first integrated circuit die and the first redistribution structure;
    a through-via disposed between the first redistribution structure and the second redistribution structure, wherein the through-via comprises:
        a first portion of the through-via; and
        a second portion of the through-via over the first portion of the through-via, wherein a porosity of a first material of the first portion of the through-via is greater than a porosity of a second material of the second portion of the through-via; and an encapsulant disposed between the first redistribution structure and the second redistribution structure, wherein the encapsulant surrounds each of the through-via and the first integrated circuit die.

9. The device of claim 8, wherein the first material of the first portion of the through-via has a lesser density than the second material of the second portion of the through-via.

10. The device of claim 9, wherein the second material of the second portion of the through-via is the same material as the first material of the first portion of the through-via.

11. The device of claim 8, wherein the second portion of the through-via has a constant width and the first portion of the through-via has a continuously decreasing width.

12. The device of claim 8, further comprising:
a package substrate; and
conductive connectors connecting the package substrate to redistribution lines of the first redistribution structure.

13. The device of claim 8, wherein the encapsulant comprises accelerators and fillers dispersed within the encapsulant, wherein the fillers comprise silica particles having a first average diameter.

14. The device of claim 13, wherein the accelerators comprise particles of an organophosphine, wherein the particles of the organophosphine have a second average diameter.

15. The device of claim 14, wherein the second average diameter of the particles of the organophosphine is greater than the first average diameter of the silica particles.

16. A device comprising:
a first redistribution structure;
a second redistribution structure over the first redistribution structure; and
a through-via disposed between and electrically connecting a metallization pattern of the first redistribution structure to a metallization pattern of the second redistribution structure, wherein the through-via comprises:
an upper portion of the through-via having a first width that is constant, wherein the upper portion comprises a first material; and
a lower portion of the through-via having a varying width, wherein the lower portion comprises a second material, and wherein a density of the second material is lower than a density of the first material.

17. The device of claim 16, wherein the lower portion of the through-via has a first corner region and a second corner region, the first corner region having a less rounded profile than the second corner region.

18. The device of claim 16, wherein the second material of the lower portion of the through-via is the same material as the first material of the upper portion of the through-via.

19. The device of claim 16, wherein the second material of the lower portion of the through-via is a different material to the first material of the upper portion of the through-via.

20. The device of claim 16, further comprising a package substrate coupled to the first redistribution structure using conductive connectors.

* * * * *